United States Patent [19]
Itoyama et al.

[11] Patent Number: 5,614,837
[45] Date of Patent: Mar. 25, 1997

[54] PROBE APPARATUS AND BURN-IN APPARATUS

[75] Inventors: Taketoshi Itoyama, Tokorozawa; Yuichi Abe; Masao Yamaguchi, both of Tokyo, all of Japan

[73] Assignee: Tokyo Electron Limited, Tokyo, Japan

[21] Appl. No.: 457,774

[22] Filed: Jun. 1, 1995

Related U.S. Application Data

[62] Division of Ser. No. 251,365, May 31, 1994, Pat. No. 5,510,724.

[30] Foreign Application Priority Data

May 31, 1993 [JP] Japan .................................. 5-154435
May 31, 1993 [JP] Japan .................................. 5-154436

[51] Int. Cl.$^6$ .................................................. G01R 31/02
[52] U.S. Cl. .............................. 324/760; 324/765
[58] Field of Search ............................ 324/754, 760, 324/765, 158.1, 73.1, 758; 414/222, 225, 226, 416; 198/345, 397, 952; 209/573

[56] References Cited

U.S. PATENT DOCUMENTS

| | | | |
|---|---|---|---|
| 4,567,432 | 1/1986 | Buol et al. ........................ | 324/760 |
| 4,775,281 | 10/1988 | Prentakis ........................ | 414/416 |
| 5,148,100 | 9/1992 | Sekiba ........................ | 324/765 |
| 5,292,393 | 3/1994 | Maydan et al. ........................ | 414/217 |

*Primary Examiner*—Vinh P. Nguyen
*Attorney, Agent, or Firm*—Oblon, Spivak, McClelland, Maier & Neustadt, P.C.

[57] ABSTRACT

A loader section for supplying semiconductor wafers is arranged at one end of a linear first convey path for a convey unit. Burn-in test sections, probe test sections, a laser repair section, a deposition repair section, a marking section, a baking section, and visual test sections are arranged on both the sides of the first convey path. In the burn-in test section arranged in the loader section, each semiconductor wafer picked up from a cassette is pre-aligned. The pre-aligned semiconductor wafers are loaded/unloaded into/from the respective test sections and the repair section by the convey unit in accordance with a predetermined test procedure, thereby performing a plurality of test items and repair steps by an inline scheme. Each burn-in test section includes a probe card having conductive projections which are brought into contact with all of many semiconductor chips formed on each semiconductor wafer at once. Each burn-in test section performs burn-in tests on a plurality of semiconductor chips with which the conductive projections are brought into contact at once, while temperature/voltage stresses are applied to the semiconductor chips.

6 Claims, 14 Drawing Sheets

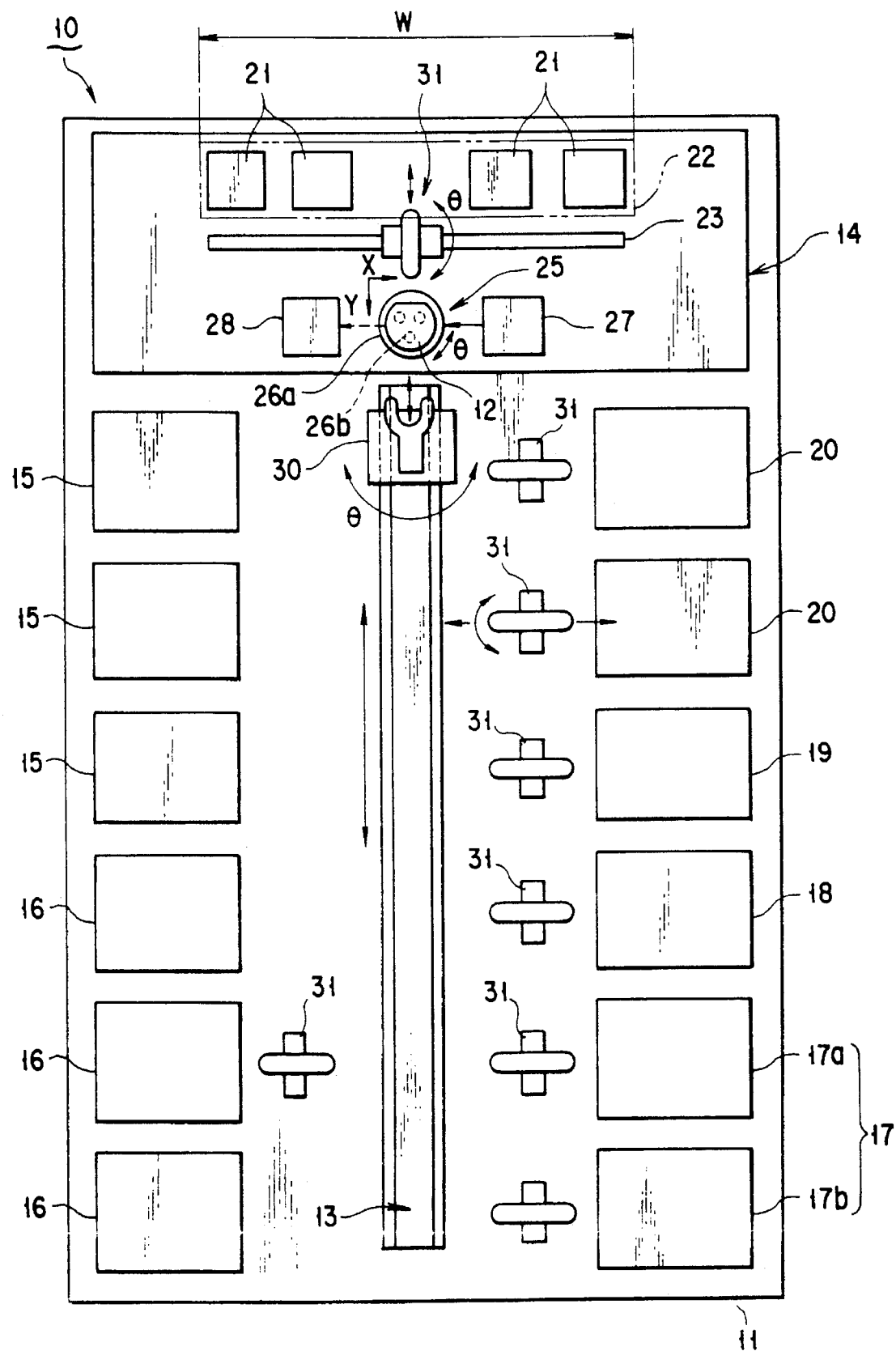
F I G. 1

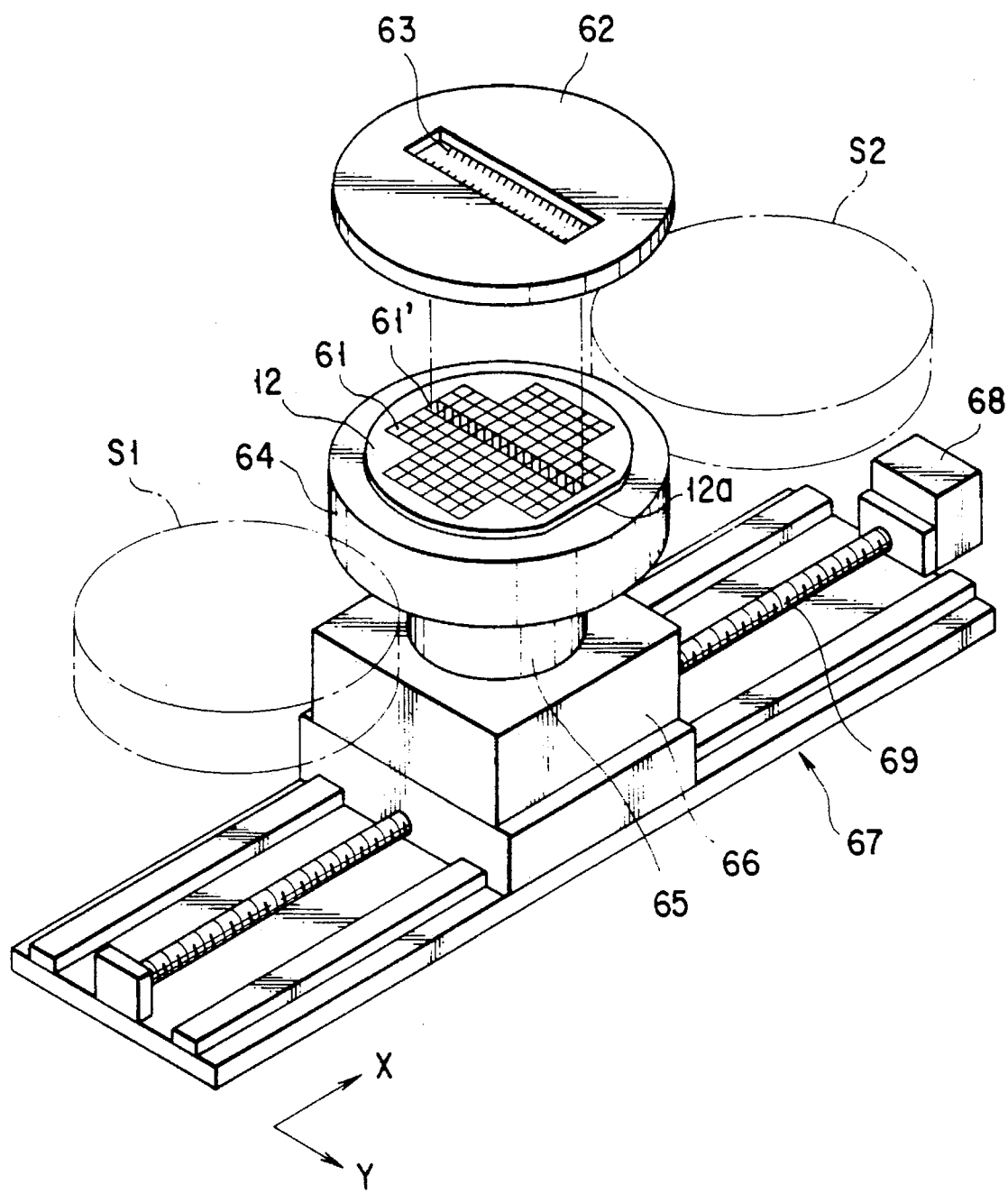
F I G. 4

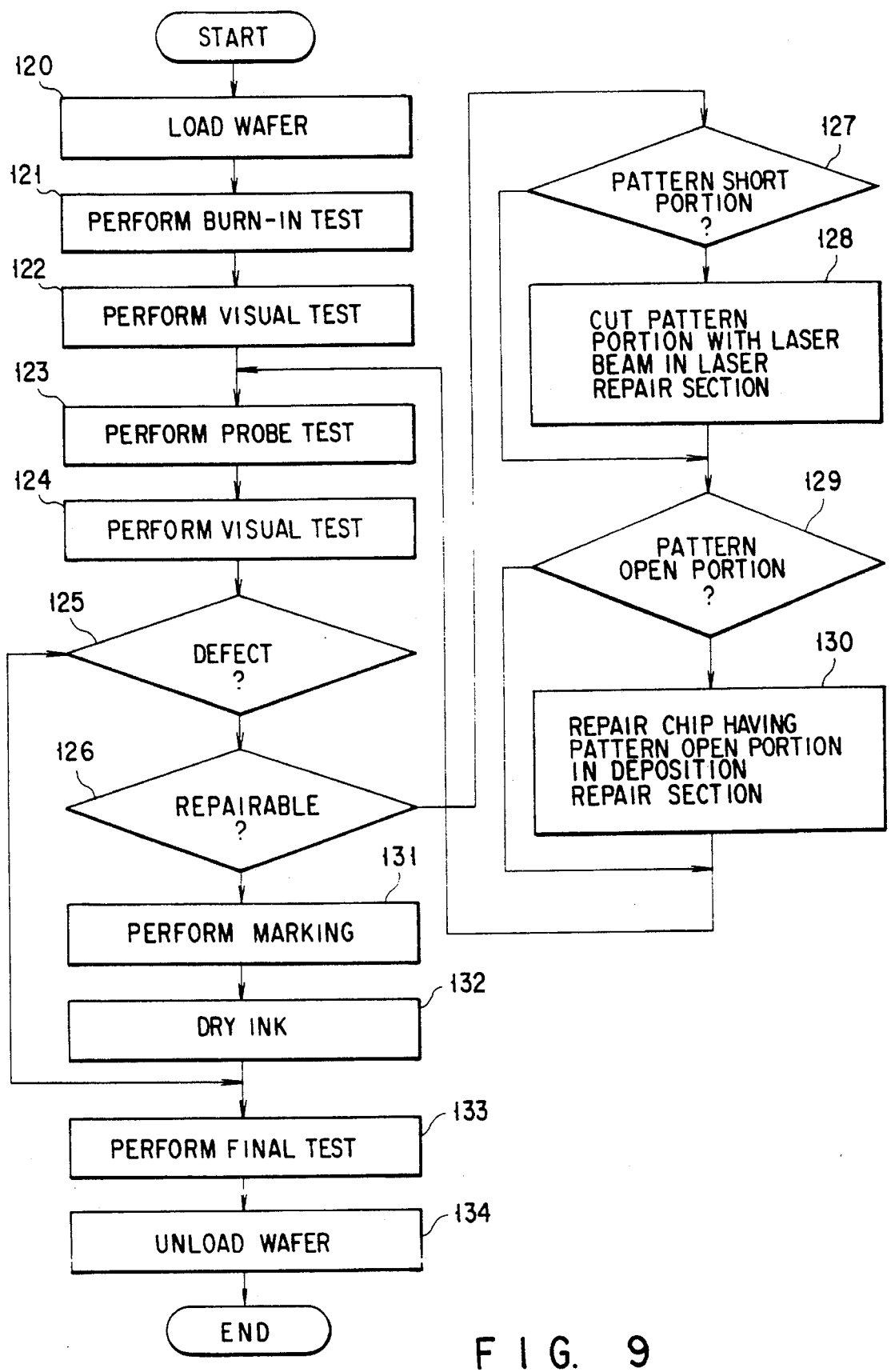
F I G. 9

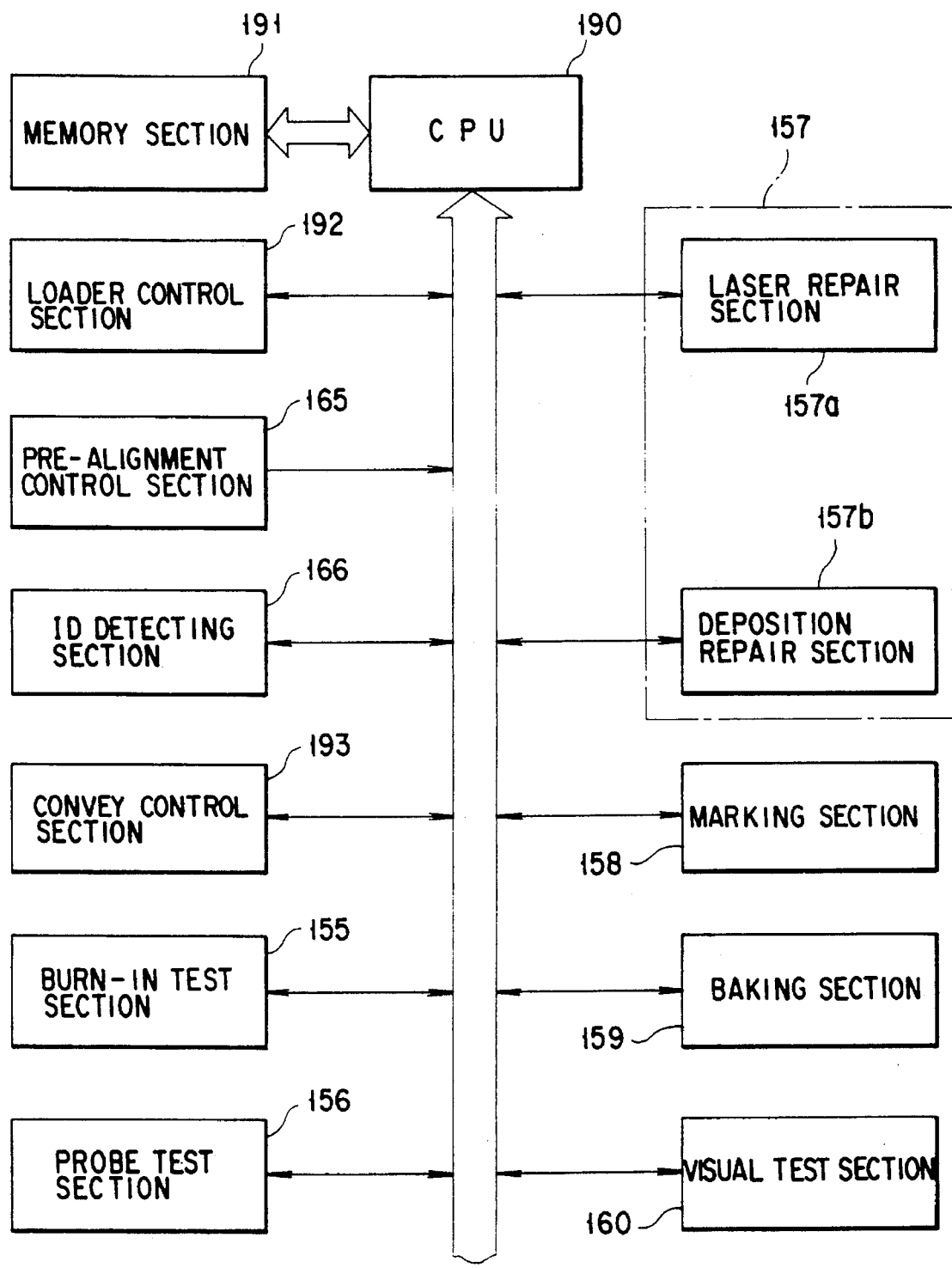
F I G. 13

PROBE APPARATUS AND BURN-IN APPARATUS

This is a Division, of application Ser. No. 08/251,365 filed on May 31, 1994, now U.S. Pat. No. 5,510,724.

BACKGROUND OF THE INVENTION

1. Field of the Invention

The present invention relates to a probe apparatus having a burn-in test function and capable of conducting burn-in tests on objects to be tested such as semiconductor chips on a semiconductor wafer and a circuit board of LCD and, more particularly, to a probe apparatus having a burn-in test function with a convey section for conveying the objects one by one. In addition, the present invention relates to a burn-in apparatus having a convey section for conveying the objects one by one.

2. Description of the Related Art

As the final steps of a semiconductor manufacturing process, a plurality of test steps are required. With tests in these test steps, the distribution of defective chips to users is prevented. A probe test is a typical test step of this type. In this probe test, a probe test apparatus is used. This apparatus has probes which are brought into contact with all the electrode pads of one chip of a large number of semiconductor chips on a semiconductor wafer. A signal pattern is supplied to each semiconductor chip by using the probe test apparatus, and an output from each chip is monitored, thereby testing the electrical characteristic of each semiconductor chip. In this probe test apparatus, in order to test all the chips on a semiconductor wafer, a wafer chuck on which the semiconductor wafer is held must be vertically moved and stepped by a distance corresponding to one chip every time a test on one chip is completed.

As the final steps of a semiconductor manufacturing process, a marking step and a repair step are performed in addition to a probe test step. In the marking step, a chip determined as a defective chip by the probe test is marked by using an ink or the like. In the repair step, a repairable defective chip is repaired. Furthermore, as a final test step, a visual test step is required, in which the semiconductor chips on a semiconductor wafer are magnified and visually observed.

There are proposed apparatuses for executing these test steps by an inline system.

The probe apparatus system disclosed in Jpn. Pat. Appln. KOKAI Publication No. 2-265255 is one example of such apparatuses. This system comprises a linear convey path on which a wafer cassette is conveyed, a plurality of test sections and a repair section arranged on both or one side of the linear convey path, and a handler for supplying semiconductor wafers mounted in the cassette to the respective test sections and the repair section. This example will be referred to as the first system hereinafter.

Another example is disclosed in Jpn. Pat. Appln. KOKAI Publication No. 4-139851, which is a test apparatus comprising a linear convey path for conveying a semiconductor wafer, a plurality of test sections and a repair section arranged on both or one side of the linear convey path, and a convey means for conveying semiconductor wafers on the linear convey path one by one and supplying the semiconductor wafers to the respective test sections and the repair section. This example will be referred to as the second system hereinafter.

The above two systems are different from each other in the following point. In the first system, a cassette is conveyed, whereas in the second system, a semiconductor wafer is conveyed. Either system can be construed as a system equivalent to a cluster tool system disclosed in U.S. Pat. No. 5,292,393 Jpn. Pat. Appln. KOKAI publication No. 3-192525 except that a convey means of a rotating convey system is replaced with a convey means of a linear convey system, and test sections and a repair section are arranged in place of a plurality of process chambers.

As a final test of a semiconductor manufacturing process, a burn-in test is conducted in addition to the above probe test. In this burn-in test, semiconductor chips are driven in a state similar to an actual driven state while temperature and/or voltage stresses are applied to the semiconductor chips, thereby finding semiconductor chips which are subjected to infant failures of semiconductor devices manufactured by using the chips. In these conventional systems, this burn-in test is not conducted on each semiconductor chip on a semiconductor wafer but is conducted on each semiconductor device obtained by cutting a semiconductor wafer into chips and packaging them.

The purpose of burn-in tests on semiconductor devices is to find devices having intrinsic defects and potential failures and remove the devices. Therefore, even if, for example, the type of a failure caused in a semiconductor device is identified, it is almost impossible to repair the device after packaging. For this reason, there is no choice but to discard semiconductor devices determined as defective devices by burn-in tests, resulting in a waste of time and money. Under the circumstances, there have been demands for burn-in tests on semiconductor chips on a semiconductor wafer.

The biggest problem in burn-in tests on semiconductor chips on a semiconductor wafer instead of semiconductor devices is that the time required for a burn-in test is longer than that required for a probe test.

Consider, for example, a 1-M DRAM as a semiconductor chip. In this case, signals must be sequentially supplied to 1,031 word lines. In addition, in order to find a failure in a gate oxide film due to a stress, the time required for a test per word line becomes considerably long. As a result, it takes about 31 hours to conduct a burn-in test on the overall 1-M DRAM as a chip.

Although this burn-in test time may be shortened by devising some wiring pattern, the following problems are posed in applying the above two inline systems to burn-in tests.

Consider, for example, a case wherein a burn-in test function is incorporated in the apparatus of the first system. In this case, the time taken for tests in one test section is equal to the time required to complete tests on all semiconductor wafers in a cassette loaded into the section. That is, until tests on a semiconductor wafer group (e.g., 25 wafers) as one lot in the test section are completed, non-processed and/or processed semiconductor wafers stored in a cassette cannot be supplied to the remaining test sections. Therefore, the remaining sections are kept in a standby/empty state. Even if another test section for conducting the same type of test is set in an empty state, non-processed semiconductor wafers stored in a cassette cannot be loaded into this test section in the empty state. Consequently, the overall operating efficiency of the apparatus decreases, and a high throughput cannot be expected.

Consider a case wherein a burn-in test function is incorporated in the apparatus of the second system. In this case, the above problem in the first system can be solved. That is, in the apparatus of the second system, since semiconductor wafers are conveyed one by one to be supplied to each test section or a repair section, processed wafers can be sequentially conveyed and supplied to the next test section or the repair section. In addition, when a specific test section is occupied, another identical test section in an empty state can be found, and a non-processed wafer can be conveyed and supplied to the section.

In the apparatus of the second system, however, probe test apparatuses or other test apparatuses as finished products are simply arranged on both or one side of a linear robot convey apparatus. For this reason, every time a semiconductor wafer is loaded into each test section or the repair section, the same operation, e.g., pre-alignment, must be repeatedly performed, resulting in a waste of time.

SUMMARY OF THE INVENTION

It is an object of the present invention to provide a probe apparatus, which can perform burn-in tests on objects to be tested and also can efficiently perform the same burn-in tests or other tests such as probe tests, a repair step, and the like in an inline system.

It is another object of the present invention to provide a burn-in apparatus for semiconductor wafers, which can perform burn-in tests on the objects, and also can efficiently perform the same burn-in tests in a plurality of test sections.

According to the present invention, there is provided a probe apparatus, comprising:

- at least one burn-in test section for performing burn-in tests on objects to be tested;
- at least one probe test section for performing probe tests on the objects;
- a repair section for repairing the objects whose defective portions are found by the burn-in test section and the probe test section;
- a convey path extending along the burn-in test section, the probe test section, and the repair section;
- a pre-alignment means for pre-aligning the objects;
- convey means, movably arranged on the convey path, for conveying the objects among the burn-in test section, the probe test section, the repair section, and the pre-alignment means; and
- a control section for controlling conveyance of the objects among the burn-in test section, the probe test section, the repair section, and the pre-alignment means,
- wherein the each objects is pre-aligned by the pre-alignment means, and the pre-aligned objects is then conveyed to the burn-in test section or the probe test section by the convey means.

In addition, according to the present invention, there is provided a burn-in apparatus comprising:

- a plurality of burn-in test sections for performing burn-in tests on objects to be tested;
- a convey path extending along the plurality of burn-in test sections;
- a pre-alignment means for pre-aligning the objects;
- convey means, movably arranged on the convey path, for conveying the objects among the plurality of burn-in test sections and the pre-alignment section; and
- a control section for controlling conveyance of the objects among the burn-in test sections and the pre-alignment section, wherein the each objects is pre-aligned by the pre-alignment section, and the pre-aligned objects is then conveyed to the plurality of burn-in test sections by the convey means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing a test/repair apparatus for semiconductor wafers according to the first embodiment of the present invention;

FIG. 4 is a schematic perspective view showing a modification of the probe test section;

FIG. 9 is flow charts for explaining the operation of the apparatus shown in FIG. 1;

FIG. 13 is a block diagram of a control system for the apparatus of the embodiment shown in FIG. 11.

DETAILED DESCRIPTION OF THE PREFERRED EMBODIMENTS

Figure 2:
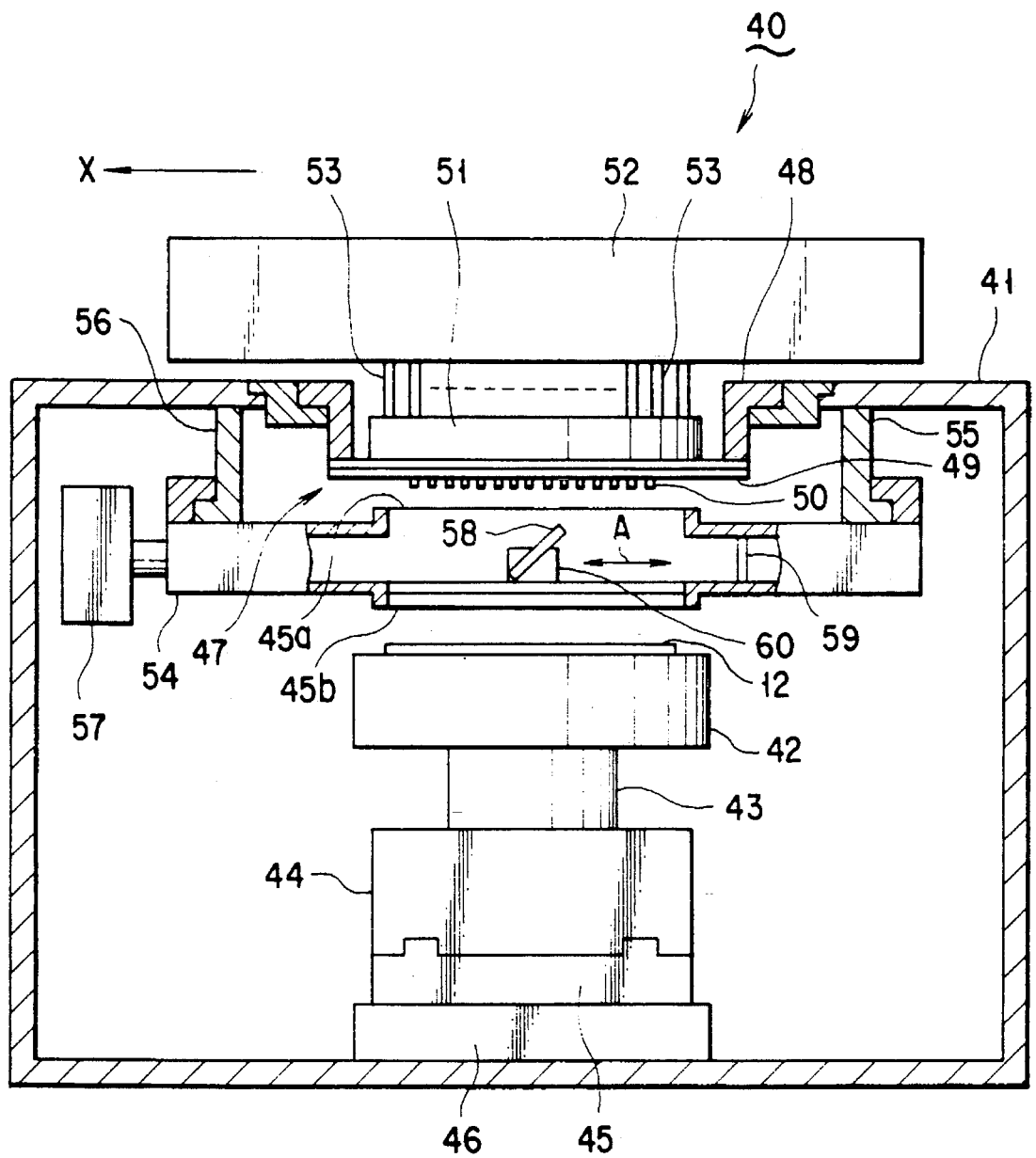
FIG. 2 is a schematic sectional view showing a probe test section in FIG. 1.

Embodiments of the present invention will be described in detail below with reference to the accompanying drawings.

FIG. 1 is a schematic plan view showing the overall layout of a probe test/repair apparatus 10 having a burn-in test function. As shown in FIG. 1, a first convey path 13 for conveying a semiconductor wafer 12 is arranged on substantially the center line of a table 11. A convey unit 30 is mounted on the first convey path 13 to be movable along the longitudinal direction of the first convey path 13.

A loader section 14 is disposed in the direction of one end of the first convey path 13. Burn-in test sections 15, probe test sections 16, a repair section 17, a marking section 18, a baking section 19, and visual test sections 20 are arranged on both sides of the first convey path 13.

A downflow section (not shown) for blowing clean air downward against the first convey path 13 and the respective test portions 15, 16 and the repair section 17 is disposed above the table 11, thereby taking a measure against dust.

A cassette mount area 22 on which four wafer cassettes 21 are mounted in a line is prepared on the loader section 14. For example, 25 wafers are stored in each cassette 21. A convey path 23 extends throughout a width W of the cassette mount area 22. A transfer unit 31 is arranged to be movable along the convey path 23.

A pre-alignment section 25 is disposed at a position where it opposes the cassette mount area 22 through the convey path 23 and is located on the extended line of the first convey path 13.

The pre-alignment section 25 has a chuck 26a, on which the semiconductor wafer 12 can be held or placed, and for example, three push pins 26b capable of protruding/retracting from/into the surface of the chuck 26a. The chuck 26a can be moved in the directions indicated by arrows X, Y and θ in FIG. 1 under the control of a pre-alignment control section 27. The semiconductor wafer 12 on the chuck 26a is pre-aligned under the control of the pre-alignment control section 27. At this time, positioning of an orientation flat 12a of the semiconductor wafer 12 is also performed. In addition, an ID detecting section 28 is arranged to detect ID information on the semiconductor wafer 12 on the chuck 26a. A character or bar code is attached, as ID information, to the semiconductor wafer 12. For example, the ID detecting section 28 optically detects this ID information.

As described above, the test sections 15, 16 and the repair section 17 are arranged on both the sides of the first convey path 13 to be spaced apart therefrom by a predetermined distance, with the sections on each side being arranged in a line. For example, in one line, three burn-in test sections 15 and three probe test sections 16 are sequentially arranged from the loader section 14 side. In the other line, the repair section 17 constituted by a laser repair section 17a and a deposition repair section 17b, the marking section 18, and the baking section 19, and for example, two visual test sections 20 are sequentially arranged from the opposite side to the loader section 14.

Each burn-in test section 15 serves to conduct a burn-in test on each semiconductor chip on the semiconductor wafer 12 while a temperature stress and/or a voltage stress are applied to each semiconductor chip on the semiconductor wafer 12. Each probe test section 16 serves to test the electrical characteristics of each semiconductor chip while none of the above stresses are applied. In the apparatus of this embodiment, since these burn-in test sections 15 and probe test sections 16 demand longer test times than the remaining test sections, the number (e.g., three) of burn-in test sections 15 and that of probe test sections 16 arranged are proportional to the test times. If a burn-in test requires a longer time than a probe test, more burn-in test sections 15 may be installed. In contrast to this, if a probe test requires a longer time than a burn-in test, more probe test sections 16 can be installed.

If, for example, it is found in the probe test section 16 that a pattern short is present in a semiconductor chip, the laser repair section 17a of the repair section 17 repairs the semiconductor chip by fusing and disconnecting the pattern short portion using a laser beam. If a pattern open is present in a semiconductor chip in the probe test section 16, the deposition repair section 17b of the repair section 17 repairs the semiconductor chip by forming a deposition film on the pattern open portion.

The marking section 18 forms a mark on a defective chip, which can be repaired by neither the laser repair section 17a nor the deposition repair section 17b, by inking or scratching.

The baking section 19 is required if the marking section 18 is of an ink marker method. The baking section 19 serves to dry the ink sprayed on a defective chip by baking. If, therefore, the marking section 18 is of a scratch marker method, the baking section 19 is not required.

The visual test sections 20 serve to conduct a visual test on the outer appearance of each semiconductor chip on the semiconductor wafer 12 by using a microscope or a TV monitor. The visual test sections 20 are used as the final test item of the apparatus 10 of the embodiment and can also be used for a visual test after a test in the burn-in test section 15 or the probe test section 16.

Transfer units 31 are arranged between at least one the first convey path 13 and the respective test sections and the repair section to transfer the semiconductor wafers 12 from/ to the convey unit 30 on the first convey path 13 between these sections.

The arrangements of each burn-in test section 15 and each probe test section 16 will be described in detail below.

Figure 3:
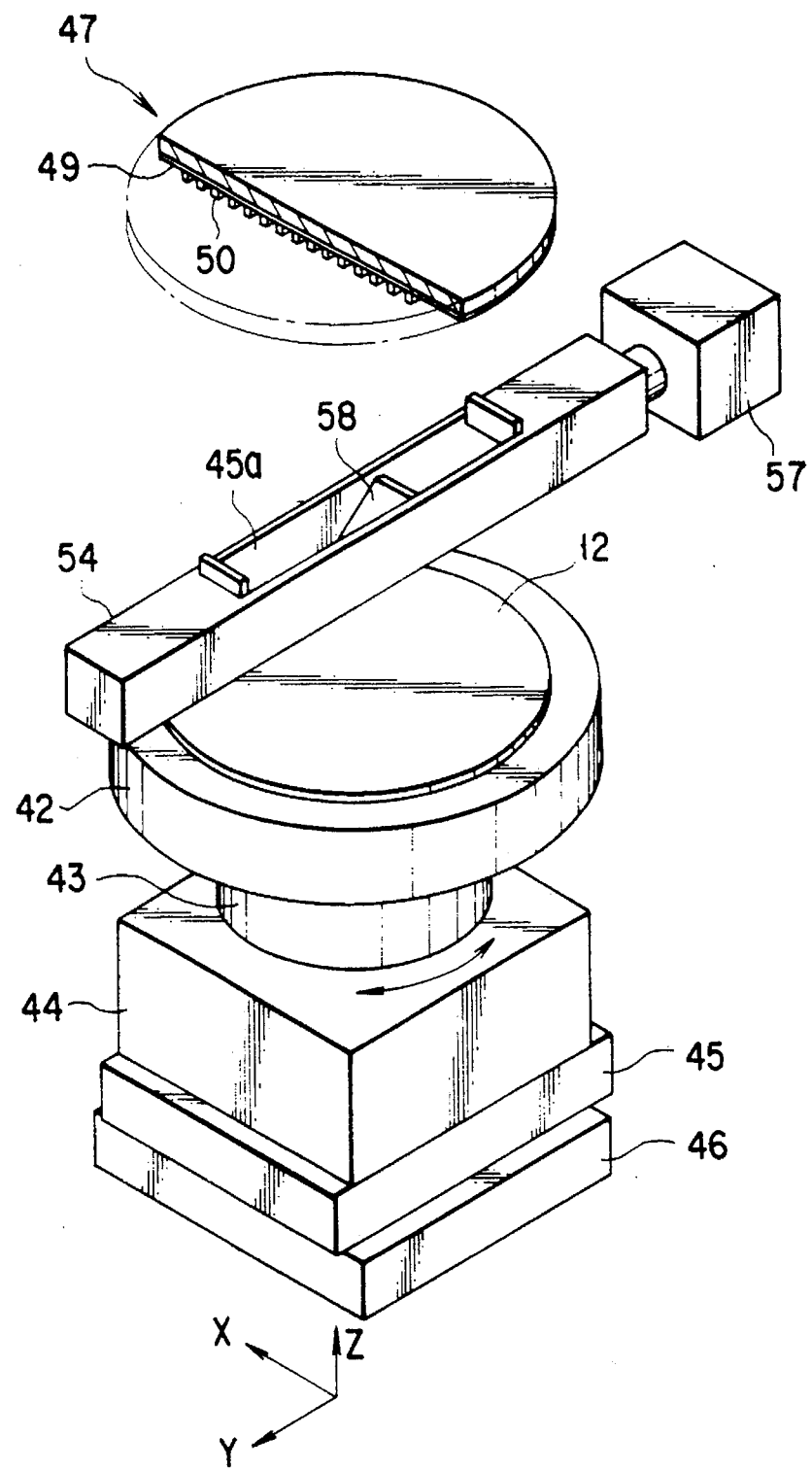
FIG. 3 is a schematic perspective view showing the structure of the probe test section in FIG. 1.

In order to efficiently conduct a burn-in test and a probe test by an inline system, the structure of the probe apparatus disclosed in U.S. Ser. No. 08/151,367 filed by the present applicant can be properly used. FIGS. 2 and 3 show a probe test section 40 as an example of the above-described probe test section. A wafer chuck 42 is disposed in a housing 41. The wafer chuck 42 holds the semiconductor wafer 12 thereon by, e.g., a vacuum chuck scheme. A rotation mechanism 43 is disposed under the wafer chuck 42 to rotate the wafer chuck 42 about a vertical axis. An elevator mechanism 44 is disposed under the rotation mechanism 43 to move the rotation mechanism 43 upward/downward.

An X-direction micro-scale movement mechanism 45 and a Y-direction micro-scale movement mechanism 46 are arranged under the elevator mechanism 44. These mechanisms 45 and 46 serve to finely move the wafer chuck 42 by distances corresponding to several semiconductor chips in the X and Y directions, respectively. As the micro-scale movement mechanisms 45 and 46, mechanisms using, for example, ball screws or piezoelectric elements can be used. In this embodiment, the X-direction micro-scale movement mechanism 45, the Y-direction micro-scale movement mechanism 46, and the rotation mechanism 43 constitute a fine alignment mechanism for performing fine alignment of the position of the semiconductor wafer 12 within a plane.

A probe card 47 is arranged above the wafer chuck 42. The probe card 47 is supported by an insert ring 48 mounted on the housing 41. A flat member 49 consisting of an elastic material is formed on the front surface side of the probe card 47. A large number of conductive projections 50 extend from the surface of the flat member 49 downward. The conductive projections 50 are arranged in correspondence with the total number of electrode pads of all semiconductor chips on the semiconductor wafer 12. Therefore, when the wafer chuck 42 on which the semiconductor wafer 12 is held is moved upward, all the electrode pads of all the semiconductor chips on the semiconductor wafer 12 are brought into contact with the conductive projections 50 of the probe card 47 at once.

Even if the semiconductor wafer 12 or the probe card 47 is inclined or distorted, variations in the height direction are absorbed by elastic deformation of the flat member 49 itself to allow all the electrode pads to be brought into contact with the conductive projections 50 of the probe card 47 at once.

A connection unit 51 having electrodes connected to all the conductive projections 50 is mounted on the rear surface side of the probe card 47. A test head 52 is disposed above the housing 41 to oppose the connection unit 51. The test head 52 incorporates a tester and has a large number of pogo pins 53 respectively connected to signal lines in the test head 52. Each pogo pin 53 is constantly biased in the protruding direction. When the respective pogo pins 53 are brought into elastic contact with the electrodes of the connection unit 51, the test head 52 is connected to the conductive projections 50 of the probe card 47.

A cylindrical fine alignment detecting portion 54 is arranged between the wafer chuck 42 and the probe card 47 to be freely moved forward and backward in the direction indicated by an arrow A in FIG. 2. The two ends of the fine alignment detecting portion 54 are guided by two guide rails 55 and 56 extending from the upper wall portion of the housing 41 inward. With this structure, the fine alignment detecting portion 54 can be retreated/moved to a region which is located below the conductive projections 50 and also located outside the range in which the wafer chuck 42 moves upward/downward.

The fine alignment detecting portion 54 has opening portions 54a and 54b respectively formed in the lower and upper surfaces of a central portion thereof. A TV camera 57, a half mirror 58, and a total reflection mirror 59 are respectively arranged at one end portion, an intermediate portion, and the other end portion of the fine alignment detecting portion 54 in the longitudinal direction. The half mirror 58 is mounted on a movable portion 60. By moving the movable portion 60 along the longitudinal direction of the fine alignment detecting portion 54, the half mirror 58 can be moved over the range from one end side to the other end side of each array of semiconductor chips arranged on the semiconductor wafer 12.

when the construction of the above probe test section 40 is to be used as the burn-in test section 15, a heating or cooling mechanism must be mounted in the wafer chuck 42 so that the temperature of each conductive projection 50 of the probe card 47, which is brought into contact with the semiconductor wafer 12, can be set to be almost equal to that of the semiconductor wafer 12 after it is heated or cooled. For example, a hot chuck may be used as the wafer chuck 42. Alternatively, a heating or cooling mechanism may be mounted in the connection unit 51 on the rear surface side of the probe card 47. In addition, the test head 52 needs to be designed such that an input signal unique to a burn-in test can be supplied to each semiconductor chip on the semiconductor wafer 12 and an output signal can be monitored.

The operation of the burn-in test section 15 will be described next. As described above, one semiconductor wafer 12 is loaded into the burn-in test section 15 via the convey unit 30 and the transfer unit 31. The semiconductor wafer 12 is placed on the wafer chuck 42 by driving a pair of tweezers of the transfer unit 31. Note that the wafer chuck 42 has, for example, three retractable push pins (not shown). After the semiconductor wafer 12 on the pair of the tweezers of the transfer unit 31 is supported on the three push pins, the pair of tweezers is moved downward. With this operation, the semiconductor wafer 12 can be placed on the wafer chuck 42. Since the wafer chuck 42 is constituted by a hot chuck, the semiconductor wafer 12 constituted by a silicon substrate having a high thermal conductivity can be heated to a predetermined temperature, e.g., 125° C., in a relatively short period of time.

Several hundred semiconductor chips, each having, for example, 32 electrode pads and a size of 8 mm×12 mm, are formed on the semiconductor wafer 12. In order to accurately bring the electrode pads of all the semiconductor chips on the semiconductor wafer 12 into contact with the conductive projections 50 of the probe card 47, fine alignment of the semiconductor chips on the semiconductor wafer 12 is performed with respect to the conductive projections 50 of the probe card 47 in the X, Y, and θ directions.

For this purpose, the fine alignment detecting portion 54 is set between the probe card 47 and the semiconductor wafer 12. With the use of the TV camera 57 in the fine alignment detecting portion 54, the semiconductor chips can be aligned with the conductive projections 50 in the X, Y, and θ directions by driving the X-direction micro-scale movement mechanism 45, the Y-direction micro-scale movement mechanism 46, and the rotation mechanism 43 while observing images of the conductive projections 50 and the surface of the semiconductor wafer 12.

An image of each conductive projection 50 is received via the opening portion 54a on the upper portion side of the fine alignment detecting portion 54 and is reflected by the half mirror 58. Thereafter, the image is picked up by the TV camera 57. An image of the surface of the semiconductor wafer 12 is received via the opening portion 54b on the lower portion side of the fine alignment detecting portion 54 and is reflected at an angle of 90° by the half mirror 58 to be directed to the total reflection mirror 59. Thereafter, the image is totally reflected by the total reflection mirror 59 to be picked up by the TV camera 57 via the half mirror 58.

In this case, images of all the semiconductor chips in the entire region on the semiconductor wafer 12 can be picked up by moving the half mirror 58 in the x direction using the movable portion 60, and moving the overall fine alignment detecting portion 54 in the Y direction.

After the above fine alignment is completed, the fine alignment detecting portion 54 is retreated from the region below the probe card 47. The wafer chuck 42 is then moved upward by the elevator mechanism 44 to bring the electrode pads of all the semiconductor chips on the semiconductor wafer 12 into contact with the conductive projections 50 of the probe card 47 at once. After this operation, known burn-in tests, i.e., dynamic burn-in tests, static burn-in tests, or monitor burn-in tests, can be conducted with respect to all the semiconductor chips on the semiconductor wafer 12. In this case, the layout pattern on the semiconductor wafer 12 may be designed such that voltage stresses can be simultaneously applied to all the semiconductor chips on the semiconductor wafer 12. With this arrangement, the processing time required for burn-in tests can be greatly shortened.

With the use of the above structure, known probing tests can be conducted in the probe test section 16 while the conductive projections 50 are in contact with all the semiconductor chips on the semiconductor wafer 12 and no temperature and voltage stresses are applied.

As described above, according to the above burn-in and probe tests, since tests can be conducted while the conductive projections 50 are in contact with the electrode pads of all the semiconductor chips on the semiconductor wafer 12, the wafer chuck 42 need not be moved upward/downward and stepwise every time each semiconductor chip is measured. Therefore, the operating time can be shortened, and the test time can be shortened accordingly, resulting in high throughput. In addition, since alignment of the wafer chuck 42 can be performed by only performing fine movement thereof in the X and Y directions, the burn-in test section 15 and the probe test section 16 can be reduced in size.

Figure 8:
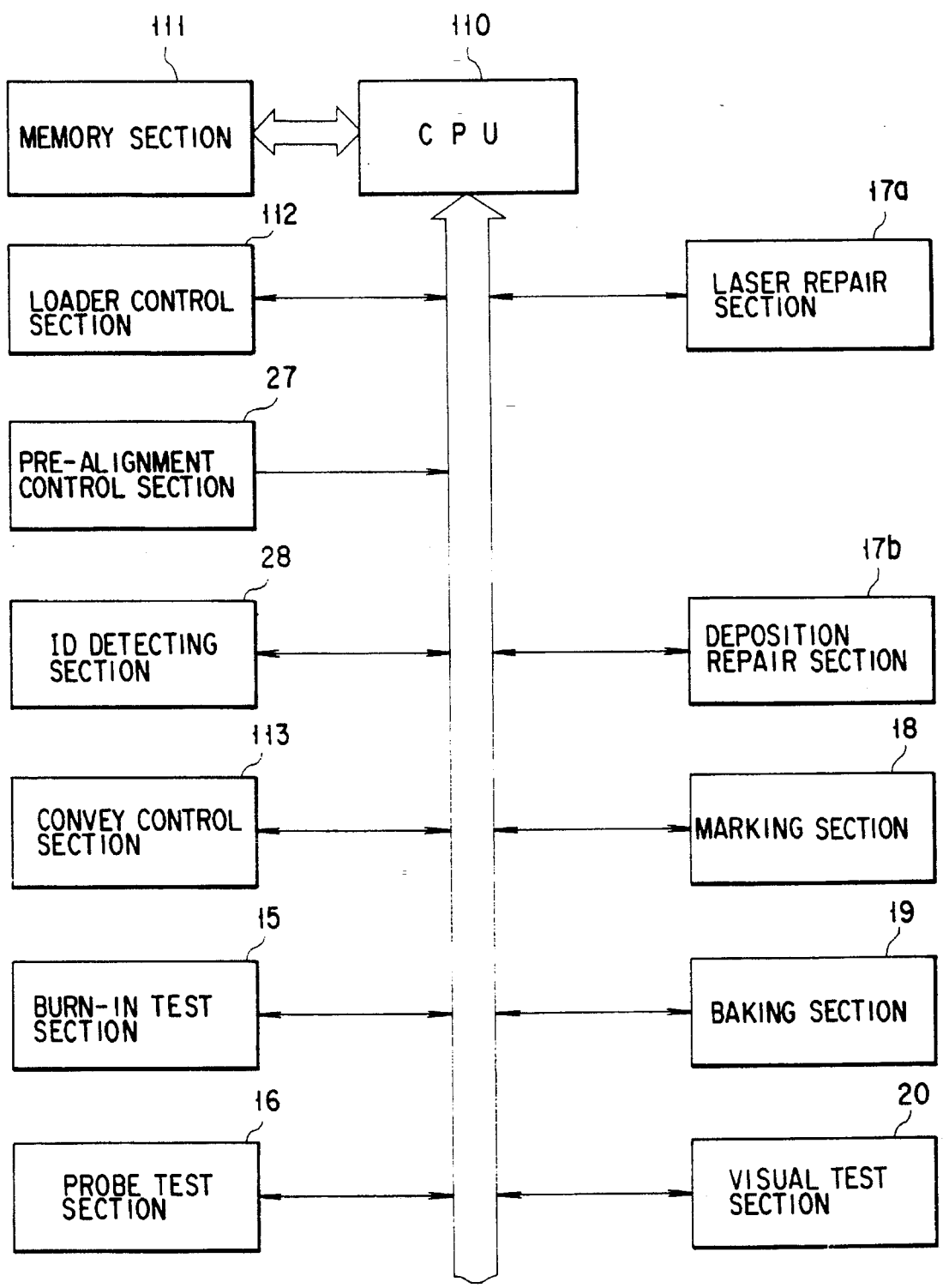
FIG. 8 is a block diagram of a control system for the apparatus of the embodiment shown in FIG. 1.

Note that defective chip data obtained by burn-in and probe tests are stored in a memory section 111 via a bus line of a CPU 110 shown in FIG. 8 in correspondence with the ID information on the wafer. Such data are supplied for a repair operation in the above repair section 17. Data associated with defective chips which cannot be repaired is supplied, as marking information, to the marking section 18 described above.

A modification of the test section will be described next with reference to FIG. 4. This modification includes a probe card 62 having probes 63 which are arranged in correspondence with, e.g., the electrode pads of all semiconductor chips 61' (hatched portion) arranged in a line in the Y direction, of all semiconductor chips 61 arranged on a semiconductor wafer 12 in the X and Y directions, and are brought into contact with these pads at once. A rotation mechanism 64, an elevator mechanism 65, and a Y-direction micro-scale movement mechanism 66 are arranged below a wafer chuck 42. A movement mechanism 67 is arranged below the Y-direction micro-scale movement mechanism 66 to move the wafer chuck 42 between transfer and positioning regions S1 and S2 for the semiconductor wafer 12 in the X direction. The movement mechanism 67 is constituted by a motor 68, a ball screw 69 which is rotated by the motor 68, and a table 70 which is moved in the X direction upon rotation of the ball screw 69.

In this modification of the test section, the wafer chuck 42 is positioned at the transfer region S1, and the semiconductor wafer 12 is placed/fixed on the wafer chuck 42 at this position. Subsequently, fine alignment of the semiconductor wafer 12 is performed as follows. The wafer chuck is set at the positioning region S2. At this position, similar to the above embodiment, positioning of the semiconductor wafer 12 is performed by using a fine alignment detecting portion 54.

In this modification, the probes 63 formed on the probe card 62 are brought into contact with the electrodes pads of all the semiconductor chips 61' arranged on the semiconductor wafer 12 in a line in the Y direction at once. Every time tests on the semiconductor chips 61' arranged in a line in the Y direction are completed, the wafer chuck is moved by the movement mechanism 67 in the X direction by a distance corresponding to one semiconductor chip 61'. By repeating this operation, burn-in or probe tests on all the semiconductor chips 61 on the semiconductor wafer 12 can be performed.

According to this modification, every time measurement of the semiconductor chips 61' arranged in a line in the Y direction is completed, the wafer chuck must be moved in the X direction by a distance corresponding to one chip, unlike the probe test section 40 shown in FIGS. 2 and 3, i.e., the scheme of bringing the conductive projections 50 of the probe card 47 into contact with all semiconductor chips at once. However, as compared with the scheme of stepping the wafer chuck in the X and Y directions every time measurement of one semiconductor chip 61 is completed, the modification allows reductions in the size and the number of components of the apparatus, and can also shorten the test time.

The convey unit 30 will be described next with reference to FIGS. 5 and 6. As shown in FIG. 6, the convey unit 30 has upper and lower forks 71 and 72. These forks 71 and 72 can be linearly moved along the convey unit 30, and can also be moved upward/downward and rotated at the stopped position. In addition, the upper and lower forks 71 and 72 can be independently moved forward/backward.

Each of the two pairs of the forks 71 and 72 has a U-shaped, flat free end portion and consists of anodized aluminum impregnated with Teflon (trade name).

Each of the pairs of the forks 71 and 72 has first and second projections 73 and 74 respectively formed on the two distal end portions of the U-shaped free end portion to protrude from the flat surface by, e.g., 0.5 mm. In addition, a third projection 75 is formed on the proximal end portion of the U-shaped free end portion at a position on the center line of each of the pairs of the forks 71 and 72 so as to protrude from the flat surface by 0.5 mm. Each of the projections 73, 74, and 75 is preferably made of Teflon (trade name) having a low sliding resistance. A ceramic material, Derlin, or the like may be used as a material for these projections.

Each of the pairs of forks 71 and 72 supports the semiconductor wafer 12 on the projections 73, 74, and 75, i.e., at three points. A suction opening portion 76 is formed in the third projection 75 to prevent movement of the semiconductor wafer 12 on each of the pairs of forks 71 and 72. With this structure, the semiconductor wafer 12 can be vacuum-chucked.

Motors 77 for independently moving the upper and lower forks 71 and 72 forward/backward are mounted on the lower surface of a support plate 91. The support plate is fixed to the upper end portion of a support pillar 90. A first pulley 78 is fixed to the rotation shaft of each motor 77, and a second pulley 79 is rotatably supported by the support plate 91 via a support member 80 at a position obliquely above the first pulley 78. A belt 81 is looped around the first and second pulleys 78 and 79.

Figure 5:
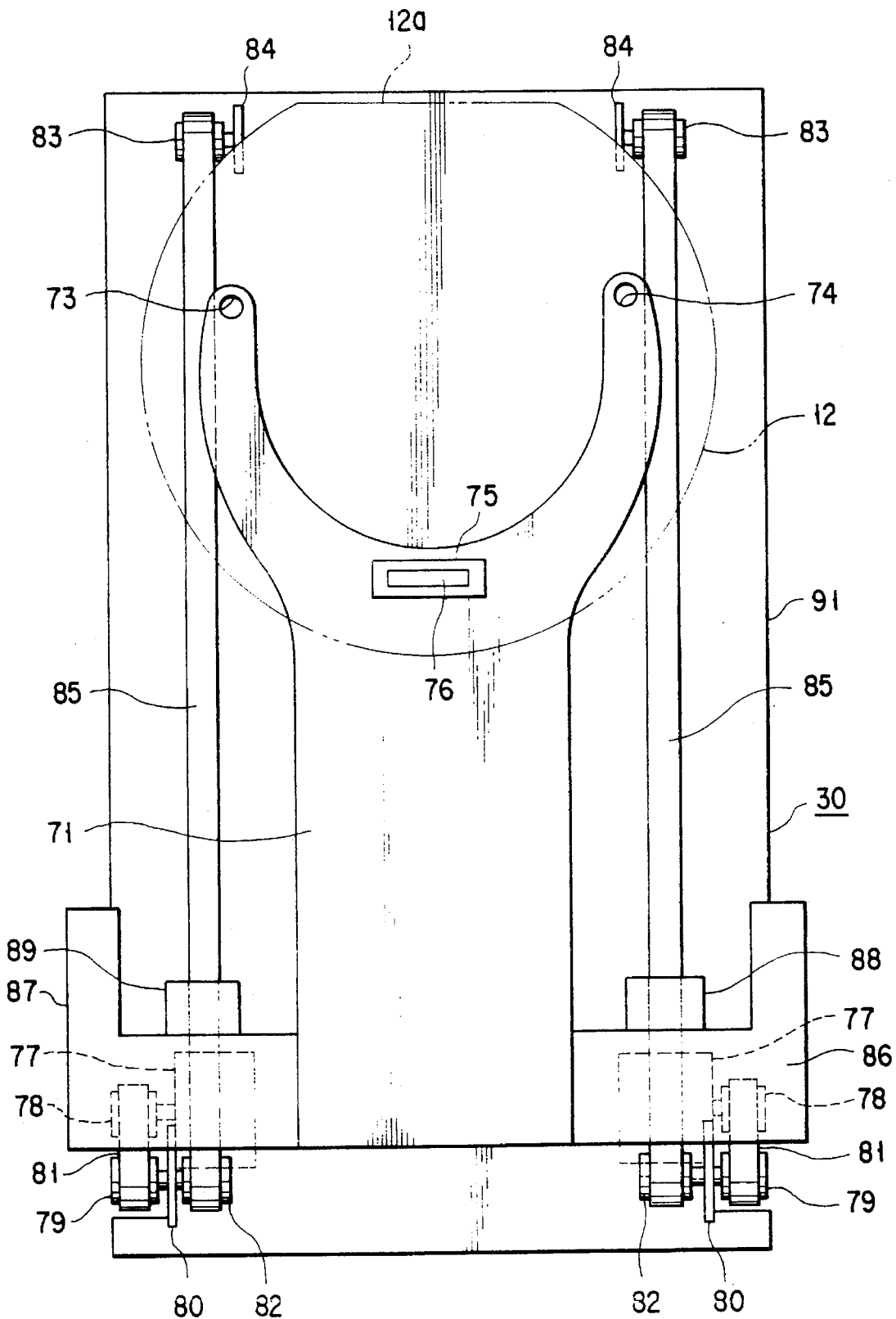
FIG. 5 is a schematic sectional view of a convey unit in FIG. 1.
Figure 6:
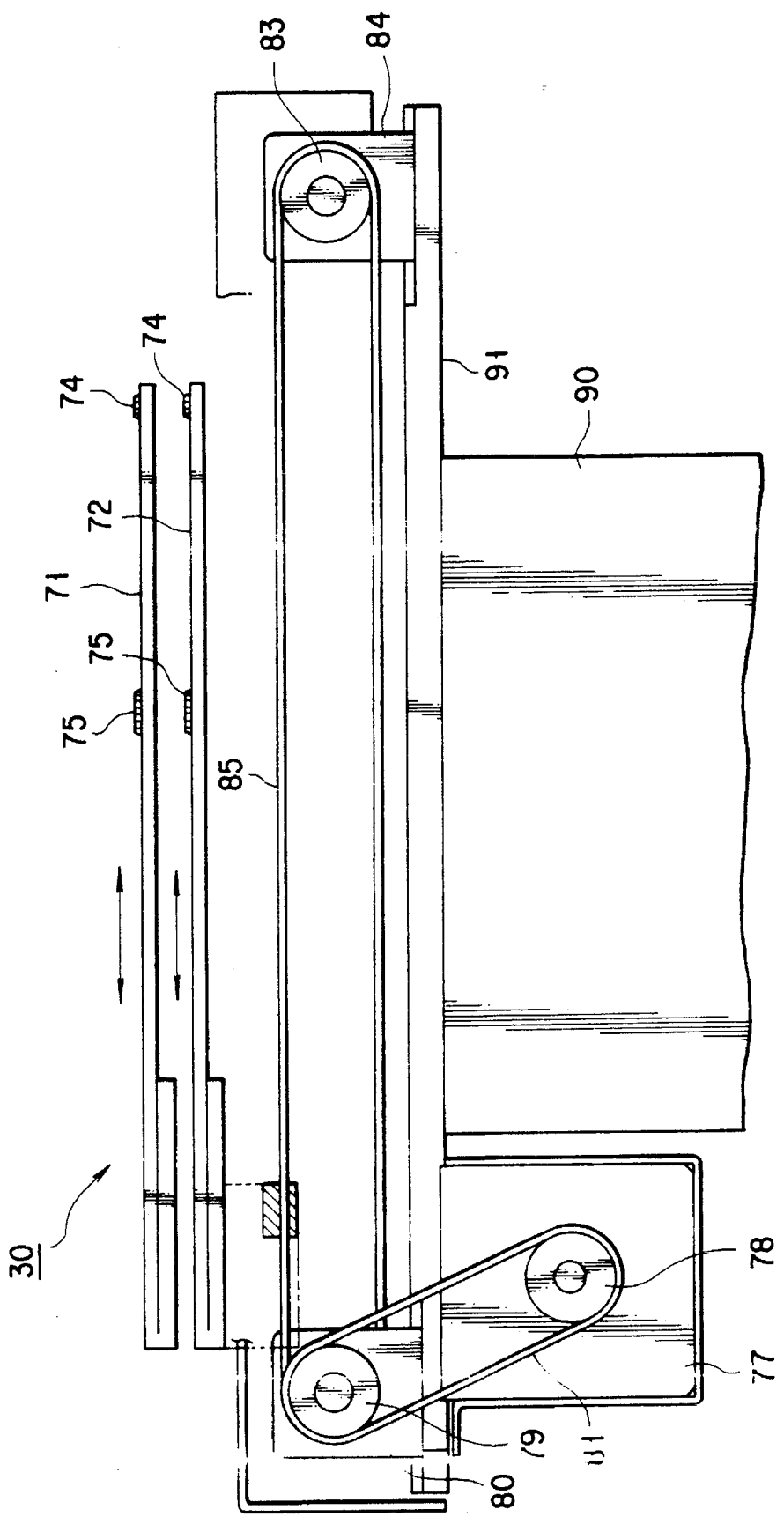
FIG. 6 is a schematic plan view of the convey unit in FIG. 5.

As shown in FIG. 5, a third pulley 82 which can be rotated coaxially and integrally with the second pulley 79 is rotatably mounted, via the support member 80, on one end side of the support plate 91, located in the direction in which each of the pairs of forks 71 and 72 moves forward/backward. A fourth pulley 83 is rotatably mounted, via a support member 84, on the other end side of the support plate 91, located in the direction in which each of the pairs of forks 71 and 72 moves forward/backward. A belt 85 is looped around the third and fourth pulleys 82 and 83.

Support arms 86 and 87 are formed on the proximal end portion of each of the pairs of forks 71 and 72 to extend in different directions. The support arms 86 and 87 respectively have coupling portions 88 and 89. The forks 71 and 72 are respectively coupled to the belts 85 via the coupling portions 88 and 89. With this structure, when the two motors 77 are independently driven, the power of the motors 77 is transmitted to the forks 71 and 72 via the belts 81, 85, thereby independently moving the forks 71 and 72 forward/backward.

According to the convey unit 30 having such a double fork structure, as described above, semiconductor wafers 12 which have undergone processes and new semiconductor wafers 12 can be quickly transferred from/to the test portions and the repair portion arranged on both the sides of the convey unit 30. For example, while a new semiconductor wafer 12 supplied from the loader section 14 is placed on the upper tweezers 71, the convey unit 30 is moved to a position opposite to the burn-in test section 15 in which a test on a semiconductor wafer has been completed. The convey unit 30 then receives the semiconductor wafer 12, which has undergone the test, from the burn-in test section 15 upon forward/backward movement of the lower fork 72. Thereafter, by driving the upper fork 71, the new semiconductor wafer 12 can be loaded into the burn-in test section 15.

The convey unit 30 for moving the semiconductor wafer 12 preferably has such a double forks structure. However, the convey unit 30 can be single fork structure. Also, in order to increase the efficiency of the convey unit 30, it may have more than three forks. In addition, the convey unit 30 may be coupled to a stock means capable to stocking one or a plurality of semiconductor wafer and mounted movably on the convey path 13. In this case, the forks 71 and 72 can be received new semiconductor wafer from the stock means, when the forks 71 and 72 have no semiconductor wafer after the supplied to the semiconductor wafers to the test sections.

The transfer unit 31 will be described next with reference to FIG. 7. The transfer unit 31 has a pair of multi-joint arms 101 and 102 which are inclined such that their moving planes cross each other. The transfer unit 31 also has an arm coupling portion 103 constituted by inclined portions 103a formed at its two ends to be inclined at the same angle as that of the multi-joint arms 101 and 102, and a horizontal portion 103b formed between the inclined portions 103a. The inclined portions 103a of the arm coupling portion 103 are rotatably supported on the distal end portions of the pair of multi-joint arms 101 and 102, respectively.

Fork 104 is fixed on the arm coupling portion 103 along a direction perpendicular to the longitudinal direction of the arm coupling portion 103. Fork 104 has vacuum chuck portions 104a capable of supporting the semiconductor wafers 12 at two ends of the tweezers 104 by, e.g., vacuum suction.

One multi-joint arm 101 is constituted by first and second arms 101a and 101b. The other multi-joint arm 102 is also constituted by first and second arms 102a and 102b. Since the two ends of each arm are rotatable, the multi-joint arm 101 has a three-joint (105a, 105b, and 105c) structure.

The transfer unit 31 also has a table 106 rotatably supporting the first arms 101a and 102a. The table 106 serves to rotate the first arm 101 by means of a motor 107 and a belt 108, thus moving the fork 104 forward/backward. The table 106 is supported by a support pillar 109 and can be rotated in the θ direction and moved in its height direction, i.e., the Z direction, by a driving means (not shown) mounted on the support pillar 109.

The transfer unit 31 arranged on the loader section 14 can load/unload one semiconductor wafer 12 into/from the cassette 21 by moving the fork 104 forward/backward and moving the overall unit upward/downward. In addition, with the above operation of the transfer unit 31, the semiconductor wafer 12 can be transferred from/to the chuck 26a arranged on the loader section 14.

The transfer units 31 arranged in front of the respective test sections and the repair section can transfer semiconductor wafers 12 from/to the convey unit 30, which is moved on the first convey path 13, between the test sections and the repair section in the same manner as described above.

The overall probe test/repair apparatus 10 having the above layout and the burn-in test function is controlled by a control system like the one shown in FIG. 8. A CPU 110 controls the apparatus 10 shown in FIG. 1. The CPU 110 can access a memory section 111 incorporating a ROM and a RAM. In addition to the respective test sections 15 and 16, the repair section 17, the pre-alignment control section 27, and the ID detecting section 28, a loader control section 112 and a convey control section 113 are connected to the bus line of the CPU 110. The loader control section 112 controls driving of the push pins 26b protruding/retracting from/into the chuck 26a, in addition to θ-direction rotation and vertical movement of the overall transfer unit 31, which moves along the second convey path 23 in the loader section 14, and forward/backward movement of the fork 104. The convey control section 113 controls driving of the convey unit 30 along the first convey path 13, in addition to θ-direction rotation and vertical movement of the overall convey unit 30, which moves along the first convey path 13, forward/backward movetment of the forks 71 and 72.

The overall operation of the semiconductor wafer test/repair apparatus having the above arrangement will be described below with reference to the flow charts shown in FIG. 9.

After one semiconductor wafer 12 undergoes ID detection in the ID detecting section 28 and pre-alignment in the pre-alignment section 25, the semiconductor wafer 12 is loaded from the loader section 14 onto the convey unit 30 on the first convey path 13 (step 120). For this purpose, the CPU 110 sends a command to the loader control section 112 to stop the transfer unit 31, controlled by the loader control section 112, at a position opposite to one of the cassettes 21. One semiconductor wafer 12 is then picked up from the cassette 21 by moving the fork of the transfer unit 31 forward, upward, and backward. In addition, the transfer unit 31 is rotated through 180°, and the semiconductor wafer 12 is placed on the three push pins 26b on the chuck 26a upon driving of the arms. Thereafter, the push pins 26b are moved downward to place the semiconductor wafer 12 on the chuck 26a. The semiconductor wafer 12 placed on the chuck 26a is pre-aligned under the control of the pre-alignment control section 27. Furthermore, ID information on the semiconductor wafer 12 is detected by the ID detecting section 28.

In the apparatus 10 of this embodiment, although fine alignment of a semiconductor wafer is performed in each of the sections including the test sections 15 and 16 and the repair section 17 after the wafer is loaded by the loader section 14, each semiconductor wafer is pre-aligned before it is loaded by the loader section 14. Since each semiconductor wafer is pre-aligned by the loader section 14, the alignment time in each of the sections including the test sections 15 and 16 and the repair section 17 can be shortened. Therefore, the number of components can be greatly reduced as compared with the case wherein a pre-alignment section is arranged in each of the sections including the test sections 15 and 16.

Subsequently, the push pins 26b are driven to protrude from the chuck 26a, and the forks 71 and 72 of the convey unit 30 on the first convey path 13 are moved forward, upward, and backward, thereby transferring the pre-aligned semiconductor wafer 12 from the loader section 14 onto the convey unit 30. After this operation, the CPU 110 executes the first test item. For example, the CPU 110 sends a command to the convey control section 113 to load the semiconductor wafer 12 into the burn-in test section 15, thus conducting a burn-in test (step 121). The convey control section 113 loads the semiconductor wafer 12 into one of the three burn-in test sections 15 which is in an empty state, by performing control to stop the convey unit 30 at a predetermined stopping position on the first convey path 13 and drive its forks 71 and 72. In this case, a transfer unit 31 having the same arrangement as that of the transfer unit 31 in the loader section 14 can be arranged between the convey unit 30 and the burn-in test section 15 so that the semiconductor wafer 12 can be loaded into the burn-in test section 15 via the transfer unit 31. With this arrangement, the operating efficiency of the convey unit 30 can be increased. In addition, the driving strokes of the forks 71 and 72 in the convey unit 30 can be reduced.

The CPU 110 repeatedly performs steps 120 and 121 such that semiconductor wafers 12 can be loaded into the remaining two burn-in test sections 15 with time lags.

In order to smoothly perform a series of operations from a burn-in test to a visual test as the final test item by an inline system, even if a plurality of burn-in test sections 15 are prepared, the test time in the first burn-in test section 15 must be shortened. In this embodiment, when a burn-in test is to be conducted in the burn-in test section 15, as shown in the FIG. 2, the conductive projections 50 are brought into contact with all the semiconductor chips on the semiconductor wafer 12 at once instead of bringing one conductive projection into contact with a single semiconductor chip on the semiconductor wafer 12. Furthermore, in the embodiment, a burn-in test is conducted with respect to a semiconductor wafer 12, unlike a conventional burn-in test which is performed with respect to a packaged semiconductor device. For this reason, the time required for a burn-in test can be shortened by, for example, forming test electrodes on a semiconductor wafer. With this operation, the time required for burn-in tests on all the 1-M DRAMs formed on an 8-inch semiconductor wafer can be shortened to about one and half hours.

In this embodiment, since the semiconductor wafers 12 are loaded into the three burn-in test sections 15 with time lags, a burn-in test on the first semiconductor wafer 12 loaded in a given burn-in test section 15 is completed first. Upon completion of the burn-in test, the CPU 110 transfers the semiconductor wafer 12, which has undergone the burn-in test, to a visual test section 20 (step 122). In the visual test section 20, after fine alignment of the loaded semiconductor wafer 12 is completed, the semiconductor chips on the semiconductor wafer 12 are visually tested by magnifying the semiconductor chips with a microscope or by displaying enlarged images of the semiconductor chips on a TV monitor. If a defective chip is detected by this visual test, the operator can input the corresponding information through an input section arranged in the visual test section 20. This information on the defective chip is stored in the memory section 111 via the CPU 110 in correspondence with the ID information on the semiconductor wafer 12. In this case, the convey unit 30 has upper and lower forks 71 and 72. Therefore, when the convey unit 30 is moved to the burn-in test section 15 which has completed a burn-in test, a semiconductor wafer 12 which has been transferred from the loader section 14 and has undergone no test can be placed on, e.g., the upper fork 71. With this operation, the convey unit 30 can load the semiconductor wafer 12 placed on the upper fork 71, which has undergone no test, into the burn-in test section 15 immediately after the semiconductor wafer 12 which has undergone the test is transferred from the burn-in test section 15 onto the lower fork 72 in an empty state.

Subsequently, the CPU 110 controls the visual test section 20 and the convey control section 113 to convey the semiconductor wafer 12, which has undergone the visual test, to the probe test section 16 for executing the next test item (step 123). The convey unit 30 driven by this convey control section 113 is moved to a position opposite to one of the probe test sections 16 which is in an empty state. Thereafter, the convey unit 30 transfers the semiconductor wafer 12 to the probe test section 16 upon control of driving of the forks.

As is known, in the probe test section 16, the conductive projections 50 are brought into contact with the electrode pads of the semiconductor chips on the semiconductor wafer 12, and input signals supplied from the tester are monitored through the tester, thereby testing the electrical characteristics of the semiconductor chips without any stress unlike in a burn-in test. In this probe test, pattern shorts and pattern opens in the semiconductor chips are tested. The test result is stored in the memory section 111 via the CPU 110.

when the probe test in the probe test section 16 is completed, the CPU 110 performs control to convey the semiconductor wafer 12 to a visual test section 20 again so as to perform a visual test on each semiconductor chip after the probe test (step 124). If a defective chip is detected, information on the defective chip is input through the input section in the same manner as described above.

In the respective test steps as steps 121 to 124, the CPU 110 checks whether a defect is present in any semiconductor chip on the semiconductor wafer 12 (step 125). If a defective chip is present, the CPU 110 checks whether the defective chip can be repaired in the laser repair section 17a or the deposition repair section 17b (step 126). If it is determined in step 126 that the defective chip can be repaired, the CPU 110 checks whether the chip can be repaired with a laser beam, i.e., whether a pattern short is present in the semiconductor chip (step 127). If the defect is a pattern short, the CPU 110 loads the semiconductor wafer 12 into the laser repair section 17a to repair the chip by fusing and disconnecting the pattern short portion with a laser beam (step 128). After step 128 is completed, or if NO is obtained in step 124, the CPU 110 checks whether the defective chip can be repaired by forming a deposition film, i.e., whether a pattern open is formed in the semiconductor chip (step 129). If a pattern open is formed, the CPU 110 loads the semiconductor wafer 12 into the deposition repair section 17b to repair the chip by forming a deposition film on the open portion (step 130).

Note that defective chip data obtained by burn-in and probe tests are stored in the memory section 111 via the bus line of the CPU 110 in correspondence with the ID information on the wafer. Such data are supplied for a repair operation in the above repair section 17. Data associated with defective chips which cannot be repaired is supplied, as marking information, to the marking section 18 described above.

As described above, according to the apparatus 10 of this embodiment, semiconductor chips with intrinsic defects and potential failures can be detected in advance by conducting burn-in tests on a semiconductor wafer, in which tests temperature and voltage stresses are applied to the semiconductor chips. In addition, a semiconductor wafer 12 having defective chips mounted thereon is loaded into the repair section 17, and repairable defective chips are then repaired by the inline system, thus greatly increasing the final yield.

If a repair is performed in the laser repair section 17a or the deposition repair section 17b in the above-described manner, the flow returns to step 123 to perform a probe test again. If it is determined in step 126 after the first or second probe test that there is a defective chip which cannot be repaired, the CPU 110 conveys the semiconductor wafer 12 to the marking section 18 to perform marking (step 131). In the marking section 18, marking is performed to make the defective chip noticeable by, e.g., spraying an ink thereon, on the basis of address information indicating the location of the defective chip under the control of the CPU 110. When marking with respect to the defective chip is completed, the CPU 110 conveys the semiconductor wafer 12 to the baking section 19 to dry the ink sprayed on the defective chip by baking (step 132). As is known, in this baking section 19, for example, the semiconductor wafer 12 is placed on a hot plate, and the ink on the defective chip on the semiconductor wafer 12 is dried through the hot plate.

After the baking step in step 132 is completed, or if it is checked after a probe test in step 125 that no defective chip is present, the CPU 110 loads the semiconductor wafer 12 into the visual test section 20 to perform a visual test (step 133). When the final visual test is completed, the CPU 110 returns the semiconductor wafer 12 into the cassette 21 via the convey unit 30, the chuck 26a in the loader section 14, and the transfer unit 31 (step 134).

In this manner, a series of processes, from the burn-in step to the visual test step and the repair step performed therebetween, is performed in the inline system. After the process in the test or repair section is completed, the CPU 110 receives the semiconductor wafer 12 from the test or repair section and loads a new semiconductor wafer 12. By repeating this operation, the above-described inline process can be repeatedly executed with respect the semiconductor wafers 12 in the four cassettes 21 mounted in the loader section 14.

As described above, according to the apparatus 10 of this embodiment, every semiconductor wafer 12 is pre-aligned before it is supplied to the linear first convey path 13. Although alignment must be performed again in the burn-in test section 15, the probe test section 16, or the repair section 17, only fine alignment needs to be performed in each section. Therefore, no mechanism for pre-alignment is required. In addition, since every semiconductor wafer 12 is pre-aligned, the time required for fine alignment can be shortened.

In addition, according to the apparatus 10 of this embodiment, a semiconductor wafer 12 having semiconductor chips which are determined as defective chips after a burn-in test is loaded into the repair section 17, and repairable defective chips are repaired. That is, defective chips, which must be discarded in the conventional method of performing a burn-in test after cutting and packaging of a semiconductor chip, can be repaired. Therefore, the final yield of products can be improved.

According to the apparatus 10 of this embodiment, a burn-in test can be performed with respect to semiconductor chips on a semiconductor wafer 12, unlike the conventional method in which a burn-in test is performed with respect to a packaged semiconductor device. Therefore, defective chips liable to infant mortality failures can be detected from a semiconductor wafer. Furthermore, since a burn-in test and a subsequent repair step can be executed by the inline system, many of defective chips which are subject to infant mortality failures can be repaired. As a result, the yield can be improved. Especially for elements which cannot be packaged, e.g., chips used for a bare chip mounting method, i.e., a chip on board (COB), and multi-chip module (MCM) chips, efficient burn-in tests can be performed only by using the apparatus 10 of the embodiment. Furthermore, even if the semiconductor manufacturing process shifts to a sheet process without using any cassette as the diameter of a semiconductor wafer increases, the apparatus 10 of the embodiment can properly perform tests and repairs without cassettes.

Figure 10:
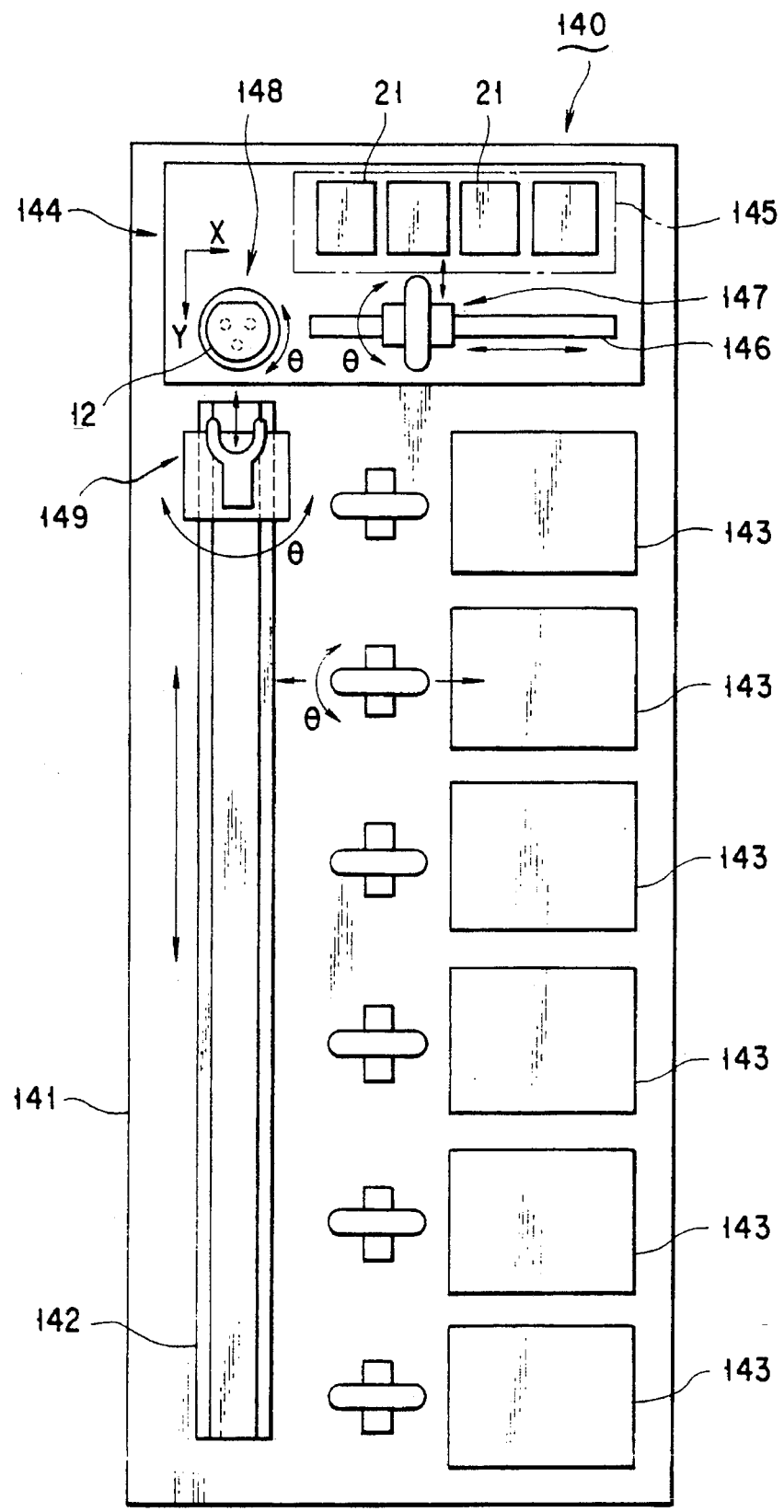
FIG. 10 is a schematic plan view showing a burn-in test apparatus according to the second embodiment of the present invention.

A burn-in test apparatus according to the second embodiment of the present invention will be described next with reference to FIG. 10. A plurality of (e.g., six) burn-in test sections 143 are arranged in a line on, for example, one side of a first convey path 142 on a table 141 shown in FIG. 10. Each burn-in test section 143 may have either the test section structure shown in FIGS. 2 to 3 or the one shown in FIG. 4. A loader section 144 is arranged at one end portion of the first convey path 142. The loader section 144 has the same arrangement as that of the loader section 14 shown in FIG. 1. That is, the loader section 144 comprises a wafer mount area 145 on which a plurality of (e.g., four) carriers 21 are mounted, a second convey path 146 extending along the wafer mount area 145, a transfer unit 147 movably arrange on the second convey path 146, and a pre-alignment section 148 arranged at one end portion of the second convey path 146. In addition, a convey unit 149 having the/same arrangement as that of the convey unit 30 shown in FIGS. 5 and 6 is movably arranged on the first convey path 142.

An apparatus 140 of this embodiment has only the plurality of burn-in test sections 143 arranged for the same test item. Therefore, unlike the apparatus 10 of the first embodiment, the apparatus 140 of the second embodiment is designed such that semiconductor wafers 12 are sequentially loaded into empty sections of the plurality of burn-in test sections 143 one by one via the convey unit 149 in accordance with the cycle time required for the burn-in test sections 143. Although each burn-in test section 143 performs burn-in tests on semiconductor wafers 12 one by one, since the semiconductor wafers 12 are efficiently loaded/unloaded by using the convey unit 149 common to the plurality of burn-in test sections 143, burn-in tests on a large number of semiconductor wafers 12 can be collectively conducted by one burn-in test apparatus.

Similar to the first embodiment, the apparatus 140 of the second embodiment can detect semiconductor chips which are subject to infant mortality failures from a semiconductor wafer 12. In addition, similar to the above embodiment, addresses and failure data associated with defective chips are registered in a memory section, and the defective chips on the semiconductor wafer 12 are repaired afterward by a repair apparatus, thereby increasing the final yield.

Figure 11:
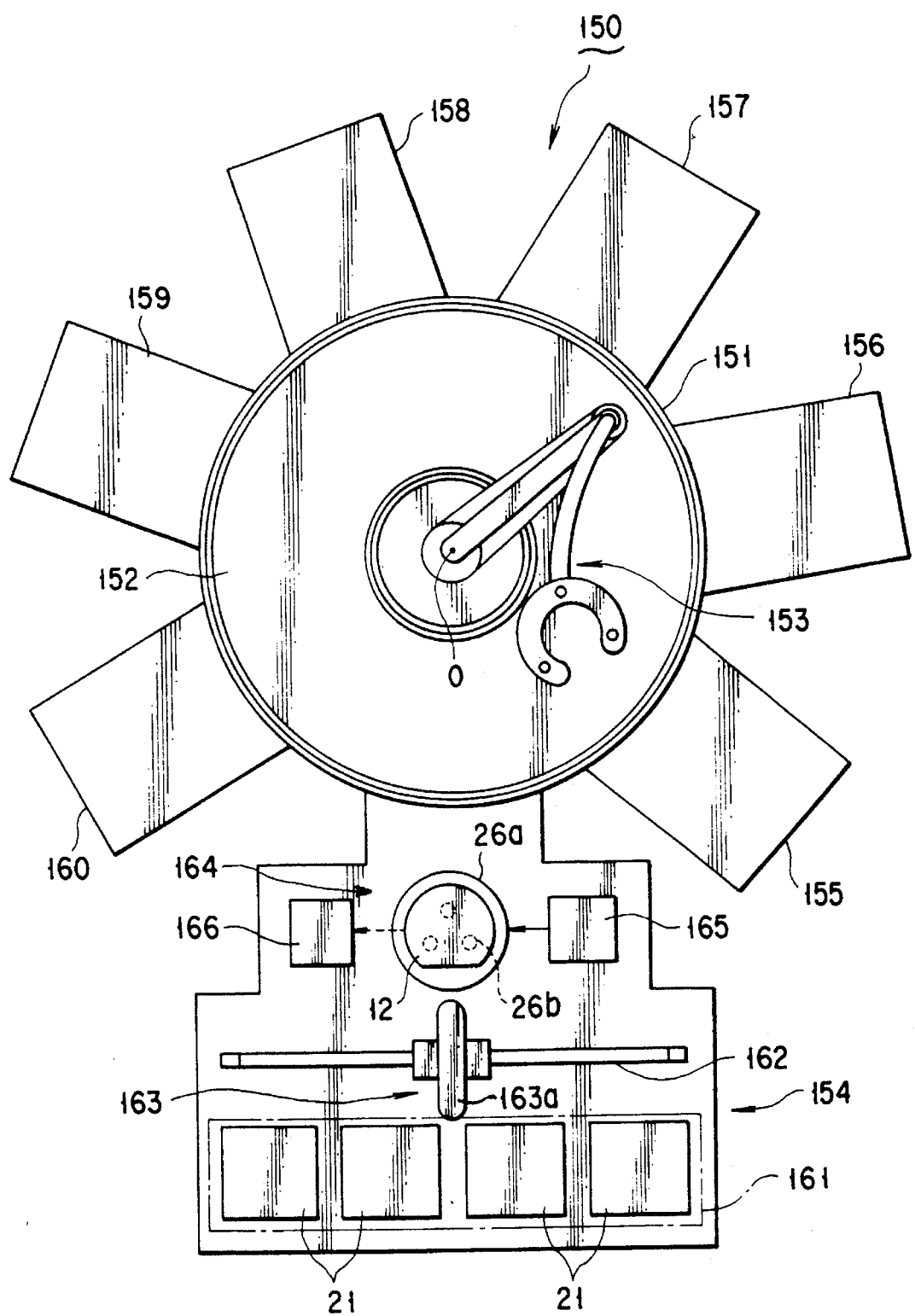
FIG. 11 is a plan view showing a test/repair apparatus for semiconductor wafers according to the third embodiment of the present invention.

A probe test/repair apparatus having a burn-in test function with a rotating convey path according to the third embodiment of the present invention will be described next with reference to FIG. 11. Referring to FIG. 11, reference numeral 151 denotes a circular frame. A rotating convey path 152 for a semiconductor wafer 12 is defined inside the circular frame 151. A convey unit 153 capable of rotating about a center 0 is arranged in the circular frame 151. A loader section 154, a burn-in test section 155, a probe test section 156, a repair section 157 having a laser repair section and a deposition repair section, a marking section 158, a baking section 159, and a visual test section 160 are radially arranged around the rotating convey path 152.

A downflow section for blowing clean air downward against the rotating convey path 152 and the sections 155 to 160 is arranged above the sections 155 to 160 and the rotating convey path 152 to oppose them, thereby taking a measure against dust.

The loader section 154 has the same arrangement as that of the loader section 14 of the first embodiment shown in FIG. 1. That is, the loader section 154 comprises a wafer mount area 161 on which a plurality of (e.g., four) carriers 21, a convey path 162 extending along the wafer mount area 161, a transfer unit 163 movably arranged on the convey path 162, and a pre-alignment section 164 arranged on the opposite side of the wafer mount area 161 through the convey path 162. In addition, a pre-alignment control section 165 and an ID test section 166 are connected to the pre-alignment section 164. The pre-alignment section 164 has the same 10 structure as that of the pre-alignment section 25 shown in FIG. 1.

The burn-in test section 155 and the probe test section 156 have the same arrangements as those of the burn-in test section 15 and the probe test section 16 of the first embodiment.

The arrangement of the transfer unit 163 arranged in the visual test section 154 will be described with reference to FIG. 7.

Figure 12:
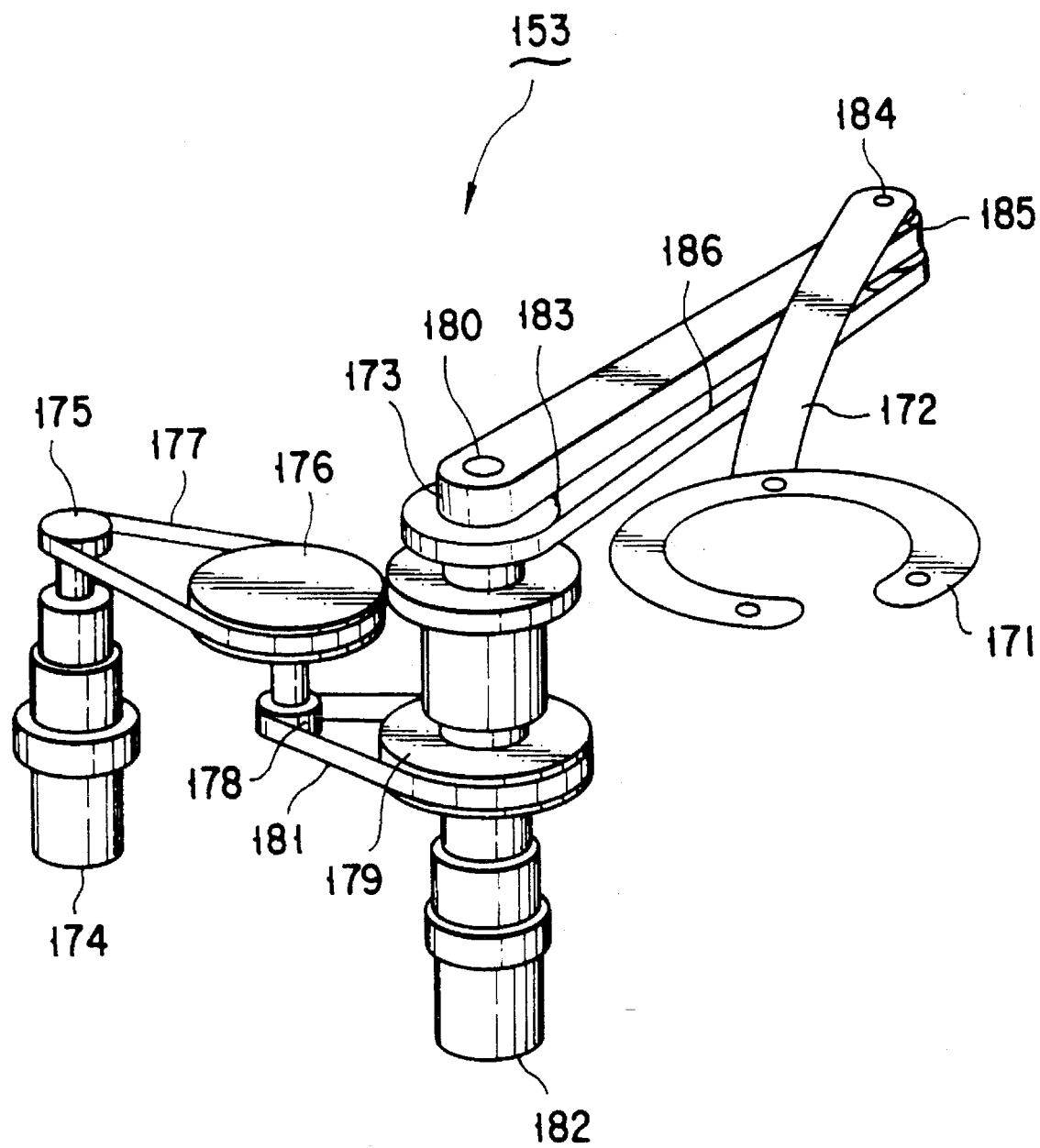
FIG. 12 is a schematic perspective view of a convey unit in FIG. 11.

The convey unit 153 will be described next with reference to FIG. 12. The convey unit 153 has fork 171 for, e.g., vacuum-chucking the semiconductor wafer 12, a first arm 172 for fixing the fork 171, and a second arm 173 rotatably coupled to the first arm 172. The convey unit 153 rotates the second arm 173 about the rotational center O of the convey unit 153 shown in FIG. 11, and also rotates the first arm 172 at the free end side of the second arm 173, thereby rotating/conveying the semiconductor wafers 12 to the respective sections 155 to 160 radially arranged around the rotating convey path 152.

The apparatus of this embodiment includes a first motor 174 for rotating the second arm 173. A first pulley 175 is fixed to the rotating shaft of the first motor 173. A belt 177 is looped around the first pulley 175 and a second pulley 176 which is adjacent thereto. A third pulley 178 is also fixed coaxially with the second pulley 178. A belt 181 is looped around the third pulley 178 and a fourth pulley 179 fixed to a rotating shaft 180 of the second arm 173. With this structure, when the first motor 174 is rotated, the rotational power is transmitted to the rotating shaft 180 to rotate the second arm 173.

The apparatus also includes a second motor 182 for rotating the first arm 172. The second motor 182 rotates a fifth pulley 183 arranged concentrically with the rotating shaft 180 of the second arm 173. A sixth pulley 185 is fixed to a rotating shaft 184 of the first arm 172. A belt 186 is looped around the fifth and sixth pulleys 183 and 185. With this structure, when the second motor 182 is rotated, the rotational power is transmitted to the rotating shaft 184 to rotate the first arm 172.

With combinations of these rotating/driving operations of the first and second arms 172 and 173, the semiconductor wafer 12 placed/fixed on the fork 171 can be rotated/conveyed along the rotating convey path 152, and can also be loaded/unloaded into/from the respective sections radially arranged around the rotating convey path 152. The overall convey unit 153 can be moved vertically so that the semiconductor wafer 12 can be transferred between a chuck 26a in the loader section 154 and the wafer chuck in one of the test sections 155 and 156 or the repair section 157.

Note that the convey unit 153 may have upper and lower fork. With this structure, when the convey unit 153 is moved to the burn-in test section 155 in which a burn-in test has been completed, a non-tested semiconductor wafer 12 received from the loader section 154 can be mounted on, e.g., the upper fork. With this operation, the convey unit 153 can load the non-tested semiconductor wafer 12, mounted on the upper fork, into the burn-in test section 155 immediately after the tested semiconductor wafer 12 is received from the burn-in test section 155 and placed on the lower forks in an empty state.

The convey unit 153 of an apparatus 150 of this embodiment rotates/conveys the semiconductor wafer 12. For this reason, unlike the case wherein a plurality of test sections and repair sections are linearly arranged, for example, no ball screw is required, and reductions in the size and cost of a convey mechanism can be achieved.

Note that the driving scheme of the above convey unit 153 is realized by extension/contraction of the fork 171, rotation of the fork 171, and rotation of the first and second arms 172 and 173. However, the present invention is not limited to this driving scheme. For example, extension/contraction of the fork 171 may be realized by a linear driving scheme.

The convey unit 153 for moving the semiconductor wafer 12 along the rotating convey path 152 preferably has a double-fork structure, as described above. However, the convey unit 153 may have one pair of fork, or may have three or more pairs of fork to increase the operating efficiency of the convey unit 153.

Figure 7:
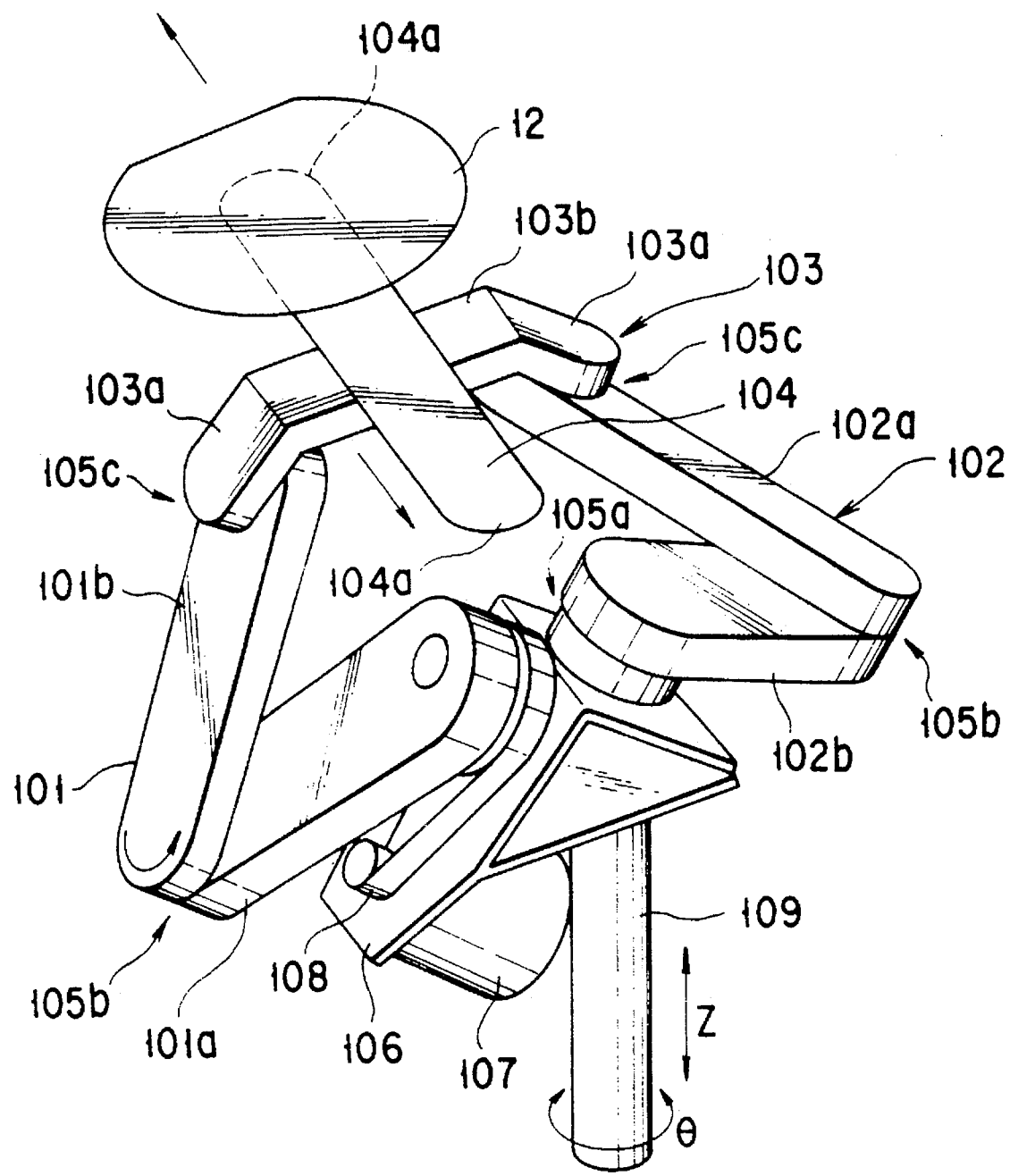
FIG. 7 is a schematic perspective view of a transfer unit in FIG. 1.

The transfer unit 163 of the loader section 154 has the same arrangement as that of the transfer unit 31 of the first embodiment shown in FIG. 7. The transfer unit 163 can load/unload one semiconductor wafer 12 into/from the cassette 21 upon forward/backward movement of fork 208 and vertical movement of the overall unit. With the above operation of the transfer unit 163, the semiconductor wafer 12 can be received/transferred from/to the chuck 26a of the pre-alignment section 164 arranged in the loader section 154.

The overall probe test/repair apparatus 150 having the above-described layout and burn-in test function is controlled by a control system like the one shown in FIG. 13. A CPU 190 controls the apparatus 150 shown in FIG. 13 and can access a memory section 191 incorporating a ROM and a RAM. In addition to the respective test sections 155 and 156, the repair section 157, the pre-alignment control section 165, and the ID detection section 166, a loader control section 192 and a convey control section 193 are connected to the bus line of the CPU 190. In the loader section 154, the loader control section 192 controls θ-direction rotation and vertical movement of the overall transfer unit 163, which moves along the convey path 162, and also controls forward/backward movement of fork 163a. In addition, the loader control section 192 controls driving of push pins 26b which protrude/retract from/into the chuck 26a of the pre-alignment section 164. The convey control section 193 controls θ-direction rotation and vertical movement of the overall convey unit 153 arranged in the rotating convey path 152, and also controls forward/backward movement of the fork 171 of the convey unit 153.

The semiconductor wafer test/repair apparatus 150 having the above-described arrangement operates in the same manner as the first embodiment in accordance with the flow charts shown in FIG. 9. First, in the loader section 154, one semiconductor wafer 12 is subjected to ID detection in the ID test section 166 and pre-alignment in the pre-alignment section 164. The semiconductor wafer 12 is then conveyed to the loader section 154 on the rotating convey path 152 (step 120). For this purpose, the CPU 190 sends a command to the loader control section 192 to stop the loader section 154, which is controlled by the loader control section 192, at a position where the loader section 154 opposes one cassette 21. Thereafter, the fork 163a of the transfer unit 163 are moved forward, upward, and backward to pick up a semiconductor wafer 12 from the cassette 21. The transfer unit 163 is rotated through 180°, and the semiconductor wafer 12 is placed on the three push pins 26b of the chuck 26a of the pre-alignment section 164 upon the subsequent arm driving operation. After this operation, the push pins 26b are lowered to place the semiconductor wafer 12 on the chuck 26a. Pre-alignment of the semiconductor wafer 12 placed on the chuck 26a is performed under the control of the pre-alignment control section 165. Furthermore, ID information recorded on the semiconductor wafer 12 is detected by the ID detection section 166.

Subsequently, the push pins 26b are caused to protrude by the chuck 26a of the pre-alignment section 164, and the forks 171 of the convey unit 153 on the rotating convey path 152 are moved forward, upward, and backward to transfer the pre-aligned semiconductor wafer 12 from the loader section 154 to the convey unit 153.

The CPU 190 sends a command to the convey control section 193 to load the semiconductor wafer 12 into a section for executing the first test item, e.g., the burn-in test section 155 (step 121). The convey control section 193 performs control to stop the convey unit 153 at a predetermined position on the rotating convey path 152 and drive the fork 171 in the convey unit 153, thereby loading the semiconductor wafer 12 into the burn-in test section 155. In this case, a unit having the same arrangement as that of the transfer unit 163 of the loader section 154 may be arranged between the convey unit 153 and the burn-in test section 155 so that the semiconductor wafer 12 can be loaded via this transfer unit 163. With this structure, the operating efficiency of the convey unit 153 can be increased. In addition, the driving stroke of the fork 171 of the convey unit 153 can be reduced.

A burn-in test on each semiconductor chip on a semiconductor wafer 12 in the burn-in test section 155 is performed in the same manner as a burn-in test in the apparatus 10 of the first embodiment.

Upon completion of the burn-in test, the CPU 190 transfers the semiconductor wafer 12 which has undergone the burn-in test to the visual test section 160 (step 122). In the visual test section 160, after fine alignment of the loaded semiconductor wafer 12 is completed, each semiconductor chip on the semiconductor wafer 12 is magnified by a microscope to be subjected to a visual test or an enlarged image of each semiconductor chip is displayed on a TV monitor to be subjected to a visual test. If a defective chip is detected by this visual test, the operator can input the corresponding information through an input section arrangement in the visual test section 160. The information on this defective chip is stored in the memory section 191 via the CPU 190 in correspondence with the ID information on the wafer 12.

The CPU 190 then controls the visual test section 160 and the convey control section 193 to convey the semiconductor wafer 12, which has undergone the visual test, to the probe test section 156 for executing the next test item (step 123). The convey unit 153 controlled by the convey control section 193 is moved to a position where it opposes the probe test section 156. Thereafter, the fork 171 of the convey unit 153 are controlled to transfer the semiconductor wafer 12 to the probe test section 156.

In the probe test section 156, a probe test on each semiconductor chip on the semiconductor wafer 12 is performed in the same manner as in the apparatus 10 of the first embodiment.

Upon completion of the probe test in the probe test section 156, the CPU 190 performs control to convey the semiconductor wafer 12 to the visual test section 160 so as to perform a visual test on each semiconductor chip after the probe test (step 124).

Subsequently, the CPU 190 checks whether any defective semiconductor chips are present on the semiconductor wafer 12 in the respective tests in steps 120 to 124 (step 125). If a defective chip is present, the CPU 190 checks whether the defective chip can be repaired in a laser repair section 157a or a deposition repair section 157b in the repair section 157 (step 126). If it is determined in step 126 that the defective chip can be repaired, the CPU 190 checks whether the defective chip can be repaired by using a laser, i.e., whether a pattern short is present in the semiconductor chip (step 127). If the defect is a pattern short, the CPU 190 loads the semiconductor wafer 12 into the laser repair section 157a to repair the chip by fusing and disconnecting the pattern short portion using a laser beam (step 128). After step 128 is completed, or if NO is obtained in step 125, the CPU 190 checks whether the defective chip can be repaired by forming a deposition film, i.e., whether a pattern open is formed in the semiconductor chip (step 129). If a pattern open is formed, the CPU 190 loads the semiconductor wafer 12 into the deposition repair section 157b to repair the pattern open portion by forming a film thereon (step 130).

As described above, in the apparatus 150 of the third embodiment, a burn-in test is performed with respect to each semiconductor chip on the semiconductor wafer 12 so that semiconductor chips having intrinsic defects and potential failures can be detected by applying temperature and voltage stresses on the semiconductor chips. In addition, the semiconductor wafer 12 having defective chips mounted thereon can be loaded into the repair section 157 by the inline system, and repairable defective chips are repaired, thereby greatly increasing the final yield.

When repairs are performed in the laser repair section 157a and/or the deposition repair section 157b in the above manner, the flow returns to step 123 to perform a probe test again. If it is determined in step 126 that a defective chip which cannot be repaired is present after the first or second probe test, the convey unit 153 conveys the semiconductor wafer 12 to the marking section 158 to perform marking (step 131). In the marking section 158, for example, an ink is sprayed on the defective chip in accordance with address information indicating the location of the defective chip under the control of the CPU 190, thereby performing a marking operation to indicate the defective chip. After marking on the defective chip is completed, the CPU 190 conveys the semiconductor wafer 12 to the baking section 159 to dry the ink sprayed on the defective chip by baking (step 132).

After the baking step in step 132 is completed, or if it is determined in step 125 that no defective chip is present after the probe test, the CPU 190 loads the semiconductor wafer 12 into the visual test section 160 to perform the final visual test (step 133). Upon completion of the final visual test, the CPU 190 returns the semiconductor wafer 12 into the cassette 21 via the convey unit 153, the chuck 26a of the pre-alignment section 164, and the transfer unit 163 (step 134).

In this manner, a series of steps with respect to one semiconductor wafer 12, from the burn-in test step to the visual test step and the repair step performed therebetween, are executed by the inline system. Furthermore, after an operation in a given test or repair section is completed, the CPU 190 receives the semiconductor wafer from the test or repair section and loads a new semiconductor wafer 12 therein. By repeatedly performing this operation, the CPU 190 can repeatedly perform the above inline process with respect to all the semiconductor wafers 12 in the four cassettes 21 mounted in the loader section 154.

As described above, according to the semiconductor wafer test/repair apparatus 150 of the third embodiment, a plurality of test sections, including the burn-in test section 155, and the repair section 157 are radially arranged around the rotating convey path 152 for semiconductor wafers 12, and the semiconductor wafers 12 pre-aligned by the pre-alignment section 164 are loaded into the respective test sections 155 and 156 and the repair section 157 via the convey unit 153 on the rotating convey path 152, thereby executing a plurality of test items, including a burn-in test, and repairs with respect to defective chips by the inline system. In conducting tests of this inline system, in the burn-in test section 155, conductive projections are brought into contact with some or all of the electrode pads of the semiconductor chips on the semiconductor wafer 12 so that burn-in tests on a plurality of semiconductor chips can be simultaneously performed while temperature and/or voltage stresses are applied to the electrode pads, thereby shortening the time required for a burn-in test and smoothly executing tests of the inline system.

A burn-in test apparatus having a circular convey path according to the fourth embodiment of the present invention will be described next with reference to FIG. 14. A burn-in test apparatus 200 of the fourth embodiment has the same arrangement as that of the probe test/repair apparatus 150 having the semiconductor wafer burn-in test function according to the third embodiment except that only a plurality of (e.g., six) burn-in test sections 201 designed to perform the same test item are arranged around a circular convey path 152.

Unlike the third embodiment, therefore, in the apparatus 200 of this embodiment, semiconductor wafers 12 can be sequentially loaded one by one into sections, of the plurality of burn-in test sections 201, which are in an empty state via a convey unit 153 in accordance with the cycle time required for each burn-in test section 201. With this operation, the semiconductor wafers 12 can be efficiently loaded/unloaded into/from the plurality of burn-in test sections 201 via the convey unit 153 common to the burn-in test sections 201 while burn-in tests on the semiconductor wafer 12 are performed one by one. Therefore, burn-in tests on a large number of semiconductor wafers 12 can be collectively performed by one burn-in test apparatus.

The apparatus 200 of the fourth embodiment is equivalent to that of the third embodiment in that semiconductor chips, on the semiconductor wafer 12, which are subject to initial mortality failures can be detected. In addition, similar to the third embodiment, in the fourth embodiment, address and defect data associated with defective chips are registered in the memory section, and the defective chips on the semiconductor wafer 12 are repaired by a repair apparatus, thereby increasing the final yield. Therefore, the same effects as those of the third embodiment can be obtained.

As described above, according to the burn-in test apparatus 200 of the fourth embodiment, the plurality of burn-in test sections 201 are radially arranged around the rotating convey path 152 along which the semiconductor wafers 12 are rotated/conveyed, and the semiconductor wafers 12 pre-aligned by a single pre-alignment section 164 are loaded one into each burn-in test section 201 via the convey unit 153. With this operation, the overall apparatus 200 can collectively and efficiently conduct burn-in tests on a plurality of semiconductor wafers 12 by the inline system while the semiconductor wafers 12 are tested one by one by the respective burn-in test sections 201.

The present invention is not limited to the first to fourth embodiments. Various changes and modifications can be made within the spirit and scope of the invention. For example, in the apparatus 10 of the first embodiment shown in FIG. 1, in place of the test sections other than the burn-in test sections 15 or the repair section arranged on the table 11, sections other than those shown in FIG. 1, e.g., other test sections or another repair section such as needle trace auto inspection or chip-size auto inspection section can be arranged. The same applies to the apparatus 150 of the third embodiment shown in FIG. 13. Consider, for example, the apparatus 10 shown in FIG. 1. In this apparatus, a pre-heater section for pre-heating the semiconductor wafer 12 before it is loaded into the burn-in test section 15 and a cooling section for cooling the semiconductor wafer 12 after a burn-in test may be arranged in the loader section 14 or around an end portion, of the first convey path 13, located on the loader section 14 side. These pre-heater and cooling sections may be arranged in the burn-in test section 15.

The procedures for tests/repairs on/to semiconductor chips in the apparatuses 10 and 150 of the first and third embodiments are not limited to the flow charts shown in FIG. 9.

In the apparatus 10 of the first embodiment, the transfer units 31 are arranged between the first convey path 13 and the respective test sections 15 and 16 and the repair section 17. However, these transfer units can be omitted. In this case, the semiconductor wafers 12 may be directly loaded into the test sections 15 and 16 and the repair section 17 via the convey unit 30. Alternatively, only one transfer unit 31 may be arranged between the first convey path 13 and the respective test sections 15 and 16 and the repair section 17. In this case, the transfer unit 31 is designed to be movable along the direction in which the test sections 15 and 16 and the repair section 17 are arranged so that one transfer unit 31 is commonly used for the respective test sections 15 and 16 and the repair section 17. This arrangement is the same as that of the apparatus 140 of the second embodiment.

In the apparatuses 10 and 150 of the first and third embodiments, the loader section is arranged on one end side of the first convey path. However, the loader section may be arranged in the same line as that of the test sections and the repair section. With this arrangement, the sequence driving control of the fork of the convey unit can be simplified.

Figure 14:
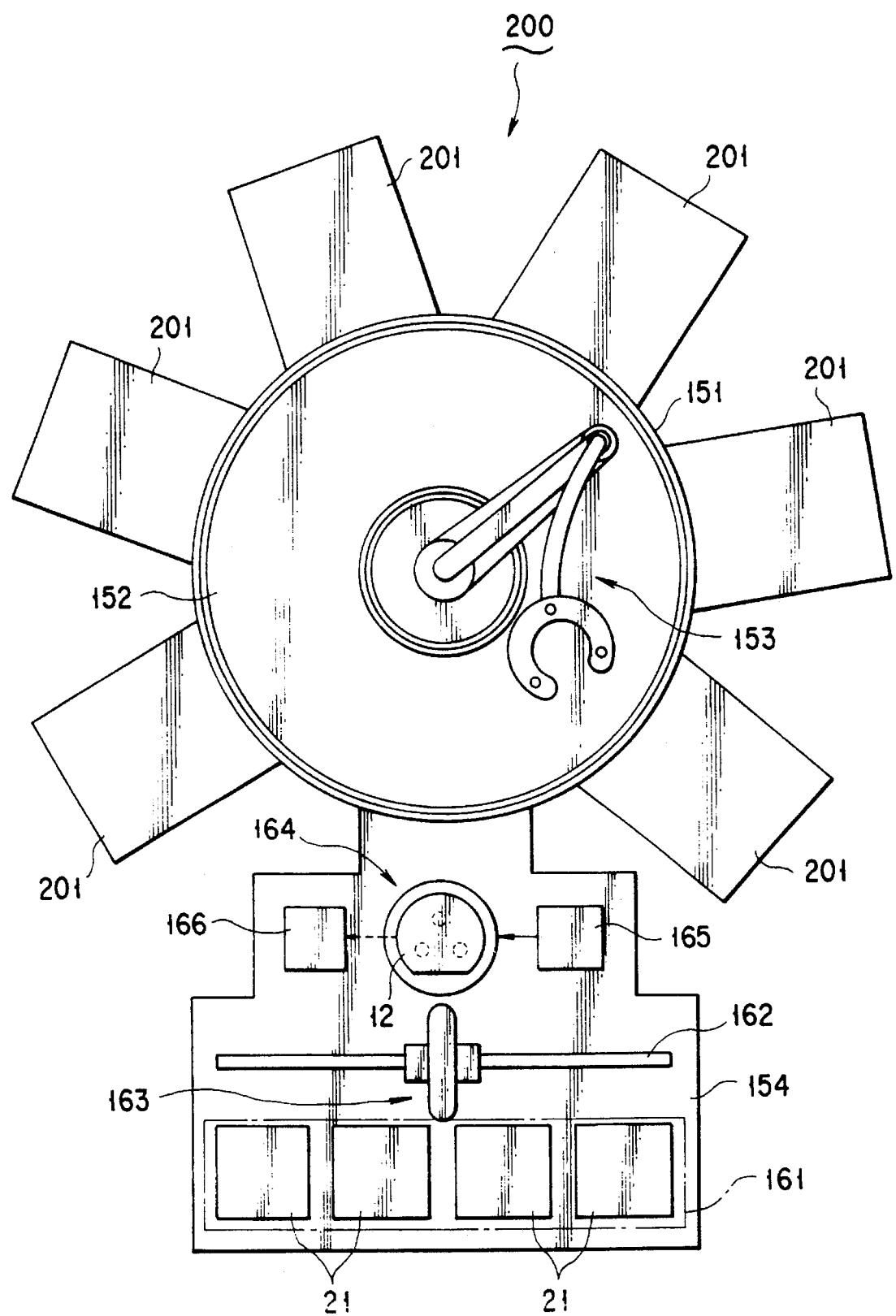
FIG. 14 is a schematic plan view of a burn-in test apparatus according to the fourth embodiment of the present invention.

Furthermore, in the apparatuses 150 and 200 of the third and fourth embodiments shown in FIGS. 11 and 14, the loader section 154 used to both load and unload the semiconductor wafers 12 is arranged at one portion around the rotating convey path 152. However, the loader section 154 may be divided into a loader section having a supply cassette and an unloader section having a return cassette, and the loader and unloader sections may be arranged at two portions around the rotating convey path 152.

The present invention described above also can be applied to a probe test and/or burn-in test on other objects to be tested such a circuit board of LCD.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A burn-in test apparatus comprising:

a plurality of burn-in test sections for performing burn-in tests on semiconductor chips formed on each of a plurality of semiconductor wafers;

a convey path extending along said plurality of burn-in test sections;

a pre-alignment means for pre-aligning the semiconductor wafers;

convey means, movably arranged on said convey path, for conveying the semiconductor wafers among said plurality of burn-in test sections and said pre-alignment means; and a control section for controlling conveyance of the semiconductor wafers among said burn-in test sections and said pre-alignment means, wherein each of said semiconductor wafers is pre-aligned by said pre-alignment means, and the pre-aligned semiconductor wafers are then conveyed to said plurality of burn-in test sections by said convey means.

2. An apparatus according to claim 1, wherein said burn-in test section comprises:

a chuck having a means for heating and/or cooling the semiconductor wafers;

a fine alignment section for performing fine alignment of the semiconductor wafers on said chuck;

a contact section which is simultaneously brought into contact with electrode pads of the semiconductor chips in an entire region or in a divided region in the semiconductor wafers; and a tester, electrically connected to said contact section, for performing burn-in tests on the semiconductor chips while temperature stresses and/or voltage stresses are applied thereto.

3. An apparatus according to claim 1, wherein said convey path is linear.

4. An apparatus according to claim 3, wherein said burn-in test sections are arranged on one side of said convey path.

5. An apparatus according to claim 1, further comprising transfer means for transferring each of said semiconductor wafers from a carrier capable of storing a plurality of semiconductor wafers to said pre-alignment means.

6. An apparatus according to claim 1, further comprising transfer means for transferring each of said semiconductor wafers between said burn-in test sections and said convey means.

* * * * *